United States Patent
Kwon et al.

(10) Patent No.: US 11,755,904 B2
(45) Date of Patent: *Sep. 12, 2023

(54) METHOD AND DEVICE FOR CONTROLLING DATA INPUT AND OUTPUT OF FULLY CONNECTED NETWORK

(71) Applicant: SAMSUNG ELECTRONICS CO., LTD., Suwon-si (KR)

(72) Inventors: Hyungdal Kwon, Suwon-si (KR); Sungho Kang, Suwon-si (KR); Cheon Lee, Suwon-si (KR); Yunjae Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 503 days.

This patent is subject to a terminal disclaimer.

(21) Appl. No.: 16/970,859

(22) PCT Filed: Feb. 20, 2019

(86) PCT No.: PCT/KR2019/002050
§ 371 (c)(1),
(2) Date: Aug. 18, 2020

(87) PCT Pub. No.: WO2019/164250
PCT Pub. Date: Aug. 29, 2019

(65) Prior Publication Data
US 2020/0380363 A1     Dec. 3, 2020

(30) Foreign Application Priority Data

Feb. 20, 2018    (KR) .................. 10-2018-0020014

(51) Int. Cl.
*G06N 3/08*      (2023.01)
*G06F 17/16*    (2006.01)
*H03M 7/46*     (2006.01)

(52) U.S. Cl.
CPC ............... *G06N 3/08* (2013.01); *G06F 17/16* (2013.01); *H03M 7/46* (2013.01)

(58) Field of Classification Search
None
See application file for complete search history.

(56) References Cited

U.S. PATENT DOCUMENTS 5,532,693 A    7/1996   Winters et al.
5,818,368 A    10/1998   Langley
(Continued)

FOREIGN PATENT DOCUMENTS

EP        1710735 A1 * 10/2006 ............. A63F 9/183
EP    3 229 473 A1    10/2017
(Continued)

OTHER PUBLICATIONS

Machine Translation of Chinese Patent Application CN-108416423-A, Aug. 17, 2018. (Year: 2018).*
(Continued)

*Primary Examiner* — Steven G Snyder
(74) *Attorney, Agent, or Firm* — Sughrue Mion, PLLC

(57) ABSTRACT

The disclosure relates to an artificial intelligence (AI) system that simulates functions such as cognition and judgment of the human brain by utilizing machine learning algorithms such as deep learning and its applications. In particular, the disclosure provides a method of controlling data input and output of a fully connected network according to an artificial intelligence system and its applications, the method including receiving, from a learning circuit, an edge sequence representing a connection relationship between nodes included in a current layer of the fully connected network, generating a compressed edge sequence that compresses consecutive invalid bits among bit strings constituting the edge sequence into one bit and a validity determination (Continued)

sequence determining valid and invalid bits among the bit strings constituting the compressed edge sequence, writing the compressed edge sequence and the validity determination sequence to the memory, and sequentially reading the compressed edge sequences from the memory based on the validity determination sequence such that the valid bits are sequentially output to the learning circuit.

15 Claims, 22 Drawing Sheets

(56) References Cited

U.S. PATENT DOCUMENTS

| | | | |
|---|---|---|---|
| 7,840,861 | B2 | 11/2010 | Sul |
| 8,533,414 | B2 | 9/2013 | Yu et al. |
| 9,769,536 | B2 | 9/2017 | Bergstrom |
| 11,308,395 | B2 * | 4/2022 | Han .................. G06N 3/045 |
| 2006/0230008 | A1 * | 10/2006 | Burgener ............ G09B 7/02 706/25 |
| 2018/0096249 | A1 * | 4/2018 | Kim .................. G06N 3/045 |
| 2021/0201133 | A1 * | 7/2021 | Kwon ................ G06N 3/082 |
| 2021/0209190 | A1 * | 7/2021 | Kung ................. G06F 1/03 |

FOREIGN PATENT DOCUMENTS

| | | |
|---|---|---|
| KR | 10-2007-0077141 A | 7/2007 |
| KR | 10-2012-0104175 A | 9/2012 |
| KR | 10-2013-0140190 A | 12/2013 |
| KR | 10-2017-0080087 A | 7/2017 |
| KR | 10-2017-0101287 A | 9/2017 |
| WO | WO-2021157067 A1 * | 8/2021 ............ G06N 3/082 |

OTHER PUBLICATIONS

'Automatic Fingerprint Identification Using Gray Hopfield Neural Network Improved by Run-Length Encoding' by Kussay Nugamesh Mutter et al., Fifth International Conference on Computer Graphics, Imaging and Visualization, copyright 2008, IEEE. (Year: 2008).*
'Zero Suppression with OpenMP—CS 462 Parallel Programming, Project #2' by Dr. Beck, archived on Dec. 2016. (Year: 2016).*
'Hadamard-Based Image Decomposition and Compression' by Iren Valova et al., IEEE Transactions on Information Technology in Biomedicine, vol. 4, No. 4, Dec. 2000. (Year: 2000).*
Bert Moons et al., "Envision: A 0.26-to-10TOPS/W Subword-Parallel Dynamic-Voltage-Accuracy-Frequency-Scalable Convolutional Neural Network Processor in 28mm FDSOI", IEEE International Solid-State Circuits Conference, Session 14, Feb. 7, 2017, pp. 246-247 (3 pages total).
Yu-Hsin Chen et al., "Eyeriss: An Energy-Efficient Reconfigurable Accelerator for Deep Convolutional Neural Networks", IEEE International Solid-State Circuits Conference, Nov. 8, 2016, pp. 1-44 (44 pages total).
International Search Report and Written Opinion (PCT/ISA/210 & PCT/ISA/237) dated May 30, 2019 issued by the International Searching Authority in International Application No. PCT/KR2019/002050.

* cited by examiner

METHOD AND DEVICE FOR CONTROLLING DATA INPUT AND OUTPUT OF FULLY CONNECTED NETWORK

TECHNICAL FIELD

The present disclosure relates to a method of controlling data input and output of a fully connected network, a device for controlling data input and output of a fully connected network, and a recording medium having recorded thereon a program for performing the method of controlling data input and output of a fully connected network.

BACKGROUND ART

An artificial intelligence (AI) system is a computer system with human level intelligence. Unlike an existing rule-based smart system, the AI system is a system that trains itself autonomously, makes decisions, and becomes increasingly smarter. The more the AI system is used, the more the recognition rate of the AI system may improve and the AI system may more accurately understand a user preference. Thus, existing rule-based smart systems have been gradually replaced by deep learning based AI systems.

AI technology refers to machine learning (deep learning) and element technologies that utilize the machine learning.

Machine learning is an algorithm technology that classifies/learns the features of input data autonomously. Element technology is a technology that utilizes a machine learning algorithm such as deep learning and includes technical fields such as linguistic understanding, visual comprehension, reasoning/prediction, knowledge representation, and motion control.

AI technology is applied to various fields as follows. Linguistic understanding is a technology to identify and apply/process human language/characters and includes natural language processing, machine translation, dialogue systems, query response, speech recognition/synthesis, and the like. Visual comprehension is a technology to recognize and process objects like human vision and includes object recognition, object tracking, image search, human recognition, scene understanding, spatial understanding, image enhancement, and the like. Reasoning prediction is a technology to acquire and logically infer and predict information and includes knowledge/probability based reasoning, optimization prediction, preference based planning, recommendation, and the like. Knowledge representation is a technology to automate human experience information into knowledge data and includes knowledge building (data generation/classification), knowledge management (data utilization), and the like. Motion control is a technology to control autonomous traveling of a vehicle and motion of a robot, and includes motion control (navigation, collision avoidance, and traveling), operation control (behavior control), and the like.

DESCRIPTION OF EMBODIMENTS

Technical Problem

Provided are a method and a device for controlling data input and output of a fully connected network. The technical solution of the present disclosure is not limited to the above-described technical problems, and other technical problems may be deduced from the following embodiments.

BEST MODE

Figure 1A:
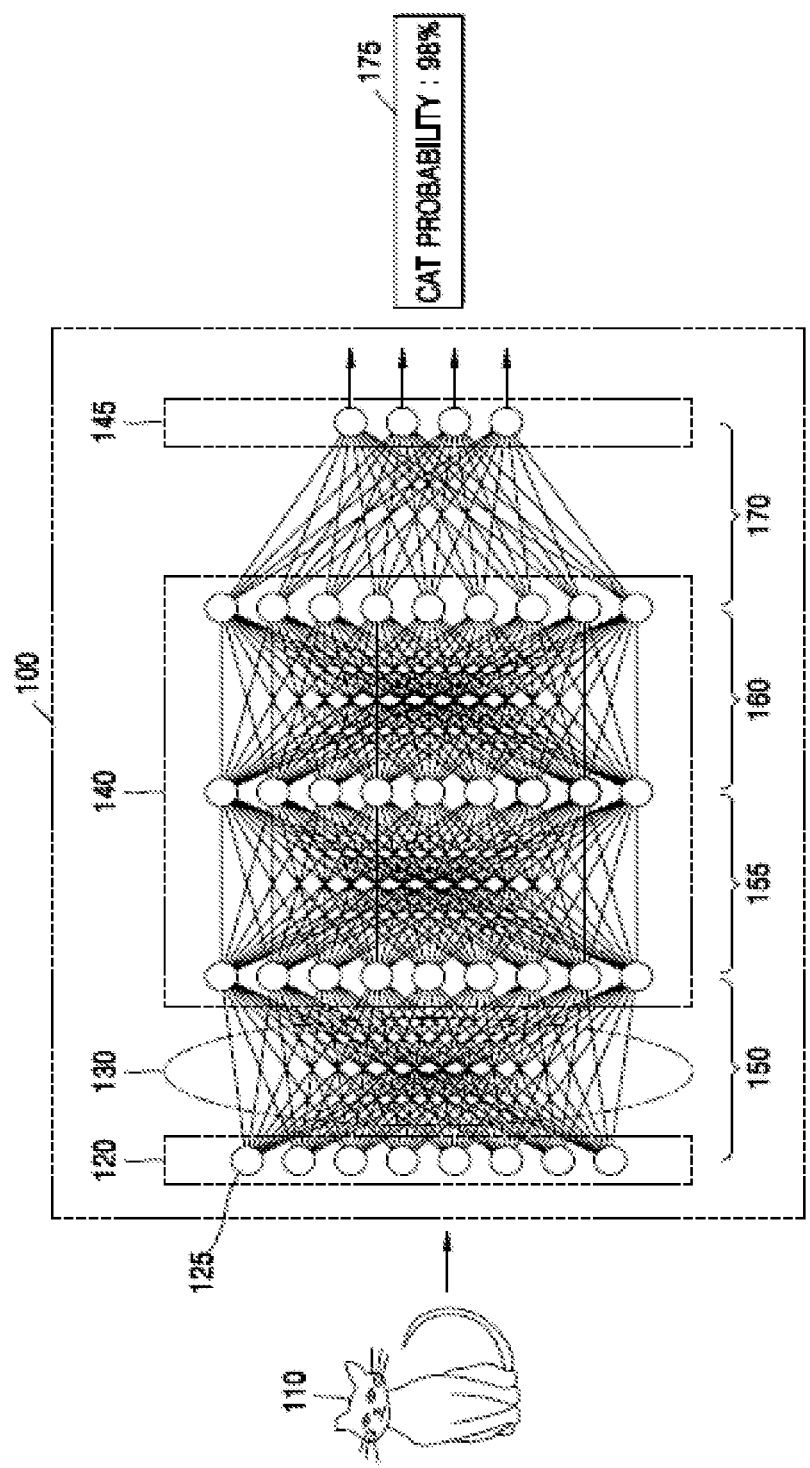
FIG. 1A is a diagram illustrating a learning method of a neural network.

According to an aspect of the present disclosure, a control device connected to a learning circuit that processes learning of a fully connected network, the control device controlling input and output of data, includes a memory; an encoding circuit configured to receive from the learning circuit an edge sequence representing a connection relationship between nodes included in a current layer of the fully connected network, generate a compressed edge sequence that compresses consecutive invalid bits among bit strings constituting the edge sequence into one bit and a validity determination sequence determining valid and invalid bits among the bit strings constituting the compressed edge sequence, and write the compressed edge sequence and the validity determination sequence to the memory; and a decoding circuit configured to sequentially read the compressed edge sequences from the memory based on the validity determination sequence such that the valid bits are sequentially output to the learning circuit.

The valid bit may be greater than a predetermined threshold, and the invalid bit may be not greater than the predetermined threshold.

The compressed edge sequence may include bits indicating the number of the consecutive invalid bits.

A bit value at a position in the validity determination sequence corresponding to a position of the valid bit in the compressed edge sequence may be '1', and a bit value at a position in the validity determination sequence corresponding to a position of the invalid bit in the compressed edge sequence may be '0'.

The decoding circuit may determine whether an output wait bit of the compressed edge sequence is valid based on the validity determination sequence, skip reading the output wait bit when the output wait bit is invalid, and read the output wait bit when the output wait bit is valid.

The validity determination sequence may be used as a clock gating signal for performing an operation of the learning circuit.

The validity determination sequence may be used to jump an operation processing step of the learning circuit.

The valid bits sequentially output from the control device may be sequentially calculated based on weight bits of a next layer of the fully connected network stored in the learning circuit.

The control device may input and output data in a first in first out (FIFO) method.

According to another aspect of the present disclosure, a control method performed by a control device connected to a learning circuit that processes learning of a fully connected network, the control device controlling input and output of data, includes receiving, from the learning circuit, an edge sequence representing a connection relationship between nodes included in a current layer of the fully connected network; generating a compressed edge sequence that compresses consecutive invalid bits among bit strings constituting the edge sequence into one bit and a validity determination sequence determining valid and invalid bits among the bit strings constituting the compressed edge sequence; writing the compressed edge sequence and the validity determination sequence to a memory; and sequentially reading the compressed edge sequences from the memory based on the validity determination sequence such that the valid bits are sequentially output to the learning circuit.

According to another aspect of the present disclosure, a computer-readable recording medium having recorded thereon a program for executing the method on a computer is provided.

MODE OF DISCLOSURE

Although the terms used in the disclosure are selected from among general terms popularly used at present under the consideration of functions in the disclosure, the terms may vary according to the intention of those of ordinary skill in the art, judicial precedents, or introduction of new technology. In addition, in a specific case, the applicant voluntarily may select terms, and in this case, the meaning of the terms is disclosed in a corresponding description part of the disclosure. Thus, the terms used in the disclosure should be defined not by the simple names of the terms but by the meaning of the terms and the contents throughout the disclosure.

Throughout the specification, when a portion "includes" an element, unless otherwise described, another element may be further included, rather than the presence of other elements being excluded. The terms, such as 'unit' or 'module', etc., described herein should be understood as a unit that processes at least one function or operation and that may be embodied in a hardware manner, a software manner, or a combination of the hardware manner and the software manner.

Embodiments of the disclosure will be described in detail in order to fully convey the scope of the disclosure and enable one of ordinary skill in the art to embody and practice the disclosure. The disclosure may, however, be embodied in many different forms and should not be construed as being limited to the embodiments set forth herein.

Reference will now be made in detail to embodiments of the disclosure, examples of which are illustrated in the accompanying drawings.

The neural network may be designed to simulate the structure of the human brain on a computer. The neural network may include an artificial intelligence neural network model or a deep learning network model developed from a neural network model. Examples of various types of deep learning networks include Fully Connected Network (FCN), Convolutional Neural Network (CNN), Recurrent Neural Network (RNN), Deep Belief Network (DBN), Restricted Boltzman Machine (RBM), and the like, but are not limited thereto.

The learning network model using the structure of the neural network includes a plurality of network nodes having weights, which simulate neurons of a human neural network. At this time, the network nodes of the neural network form links with other network nodes. The plurality of network nodes may be designed to simulate synaptic activity in which neurons send and receive signals through synapses.

The disclosed embodiment relates to the processing of data based on the neural network described above. More specifically, the disclosed embodiment relates to reducing power consumption and increasing processing speed by compressing data without loss and reducing data read/write frequency to a memory in an operation processing process based on the FCN. According to the disclosed embodiment, efficient use of the memory in a data input/output control device may be promoted.

In addition, the disclosed embodiment may reduce data traffic and associated storage capacity relating to intermediate results during the forward execution of the neural network. Here, executing the neural network may mean processing data of the neural network using a layer (for example, using a device such as a processor or a computing unit). Also, an example of "processing data" may include updating the connection weight between neurons in the FCN. Also, the "intermediate result" may mean an operation result performed in at least one layer in the neural network.

FIG. 1A is a diagram illustrating a learning method of a neural network 100.

Referring to FIG. 1A, the neural network 100 includes an input layer 120, a hidden layer 140 and an output layer 145. In FIG. 1A, an example of a fully connected network (FCN) classifying and outputting information included in input data is illustrated. Specifically, when the input data is image data, the neural network 100 outputs result data obtained by classifying types of image objects included in the image data as output data.

A plurality of layers forming the neural network 100 may include a plurality of nodes (e.g., 125) receiving data. And, two adjacent layers are connected to a plurality of edges (e.g., 130) as shown. Because each node has a corresponding weight value, the neural network 100 may obtain output data based on an operation value of an input signal and a weight value, for example, a multiplication operation value.

Referring to FIG. 1A, the input layer 120 receives input data, for example, image data 110 including a cat as an image object.

In addition, the neural network 100 may include a first layer Layer 1 150 formed between the input layer 120 and a first hidden layer HIDDEN LAYER1, a second layer Layer 2 155 formed between the first hidden layer HIDDEN LAYER1 and a second hidden layer HIDDEN LAYER2, a third layer Layer 3 160 formed between the second hidden layer HIDDEN LAYER2 and a third hidden layer HIDDEN LAYER3, and a fourth layer Layer 4 170 formed between the third hidden layer HIDDEN LAYER3 and the output layer OUTPUT LAYER 145.

The plurality of nodes included in the input layer 120 of the neural network 100 receives signals corresponding to the input data 110. In addition, through an operation in the plurality of layers included in the hidden layer 140, the output layer 145 may output the output data 175 corresponding to the image data 110. In the illustrated example, the neural network 100 may output the output data 175 of 'Cat probability: 98%' by performing an operation to classify the types of image objects included in the input image. In order to increase the accuracy of the output data 175 output through the neural network 100, the output layer 145 may perform learning in the direction of the input layer 120 and correct weight values to increase the accuracy of the output data.

As such, the neural network 100 may adjust connection weights of at least one node in a layer through learning. At this time, an overfitting problem may occur in a process of adjusting the weights. Overfitting refers to a situation in which the output accuracy of newly input data deteriorates due to excessive concentration on learning data. As a method used to solve this overfitting problem, an operation using a technique such as dropout or pruning is also used. The operation such as dropout and pruning refers to a technique capable of improving learning performance by omitting unnecessary operations in the neural network.

Figure 1B:
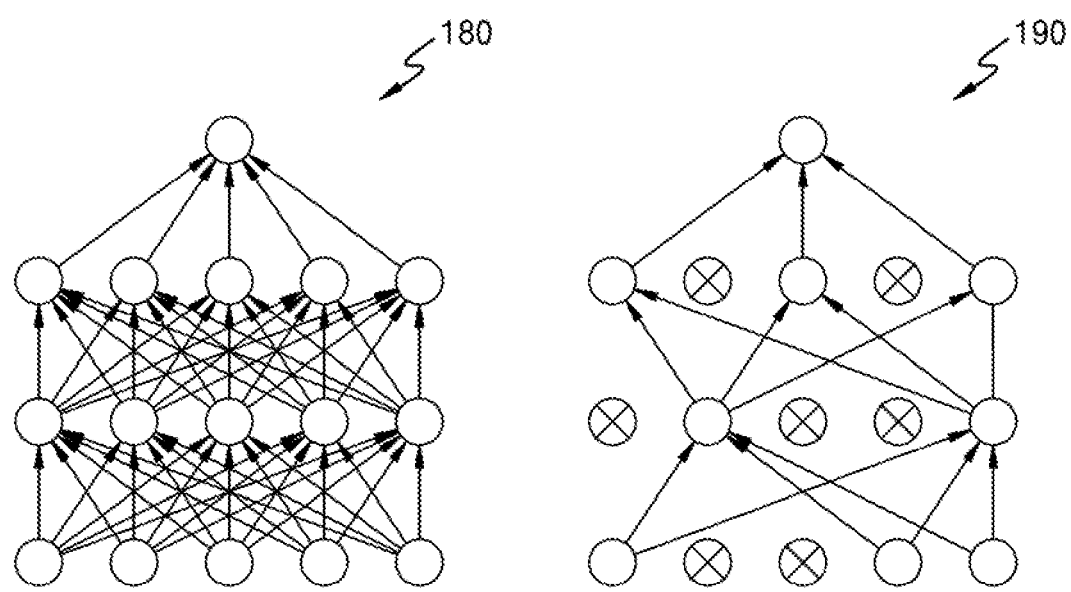
FIG. 1B is a diagram illustrating a method of omitting unnecessary operations in a neural network to improve learning performance.

FIG. 1B is a diagram illustrating a method of omitting unnecessary operations in a neural network to improve learning performance.

Referring to FIG. 1B, a fully connected neural network 180 and a neural network 190 in which some connections are omitted are illustrated. The neural network 190 in which some connections are omitted has fewer nodes and fewer edges than the fully connected neural network 180. For example, the neural network 190 in which some connections are omitted may be a network to which dropout is applied.

One of methods that may be used to improve the learning performance of the fully connected neural network 180 may be a model combination. For the model combination, it is necessary to train using different training data, or models must have different structures. However, when a network is deep, training a plurality of networks has a problem that a large amount of operation is required. Dropout is intended to solve this problem, and instead of creating a plurality of models, some neurons may be omitted at random during the learning cycle. In this case, the effect of training various models exponentially as much as the combination of the omitted neurons arises, and thus the effect of the model combination may be enjoyed.

Referring to FIG. 1B, the number of edges of the neural network 190 in which some connections are omitted may be less than that of the fully connected neural network 180. Accordingly, the neural network 190 in which some connections are omitted may include a plurality of bit values '0' indicating 'disconnection' among edge sequences indicating a connection relationship between nodes.

Hereinafter, a practical method of omitting unnecessary operations from the operation of a neural network to which the aforementioned dropout or pruning is applied will be described in detail. According to the disclosed embodiment, multiplication of a matrix and a vector used in an operation process of a neural network (e.g., a fully connected network) may be quickly performed with low power.

Figure 2:
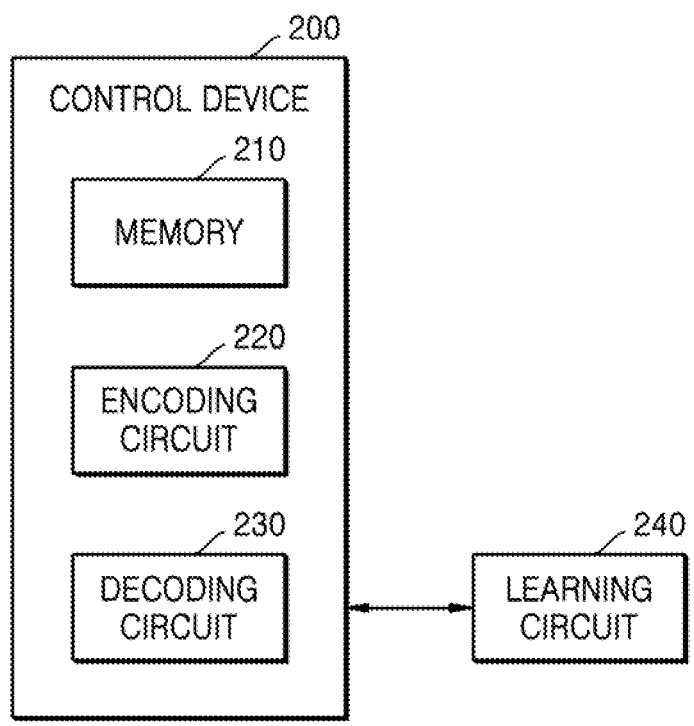
FIG. 2 is a block diagram of a control device according to an embodiment.

FIG. 2 is a block diagram of a control device 200 according to an embodiment.

Referring to FIG. 2, the control device 200 includes a memory 210, an encoding circuit 220 and a decoding circuit 230. The control device 200 may be connected to a learning circuit 240 that performs learning of a neural network. The control device 200 may receive information output in an operation process of the learning circuit 240, and may transmit information generated by the control device 200 to the learning circuit 240.

The learning circuit 240 may perform an operation through the neural network including an input layer, a hidden layer, and an output layer. Here, the hidden layer may include a plurality of layers, for example, a first layer, a second layer, a third layer, and the like. The operation of the neural network performed in the learning circuit 120 is as described above with reference to FIGS. 1A to 1B.

The control device 200 according to an embodiment may receive data from the learning circuit 240 in a first-in-first-out method (FIFO) method, and output data to the learning circuit 240. The learning circuit 240 may process information in units of each layer in the neural network. At this time, a waiting time may exist for each layer in the information processing process of the learning circuit 240. For example, an operation result with respect to the first layer may be reprocessed or processed for a predetermined waiting time after the operation on the first layer. The reprocessing or processing of the operation result may be performed through the control device 200. The control device 200 may process the operation result of the first layer and transmit the operation result to the learning circuit 240. The processed operation result received by the learning circuit 240 from the control device 200 may be used for the operation of the second layer. The control device 200 may sequentially receive data from the learning circuit 240 and sequentially output processed data to the learning circuit 240.

The memory 210 according to an embodiment may store a sequence or a bitstream having a predetermined size.

The sequence according to an embodiment may be information related to whether edges are connected between nodes constituting a plurality of layers included in the neural network. Specifically, the sequence may be information indicating connection or disconnection of each of a plurality of edges formed in one layer included in the neural network. For example, referring to FIG. 1A, the sequence may be information related to an edge sequence indicating a connection relationship between each of the plurality of edges 130 included in a predetermined layer, for example, the first layer 150.

According to an embodiment, each value of bit strings constituting the sequence may represent a connection strength of a predetermined edge. For example, the larger the bit value may mean the stronger the connection strength of the predetermined edge, and the smaller the bit value may mean that the weaker the connection strength of the predetermined edge. Hereinafter, the information indicating the connection strength of predetermined edges as the sequence is referred to as an "edge sequence".

The sequence according to an embodiment may be information related to a sequence that distinguishes a valid bit and an invalid bit from among bit strings constituting the edge sequence. For example, a value '0' included in the bit strings constituting the sequence may indicate that a bit of an edge sequence corresponding to an address of the corresponding bit is the invalid bit. Further, for example, a value '1' included in the bit strings constituting the sequence may indicate that a bit of an edge sequence corresponding to an address of the corresponding bit is the valid bit. Whether the bit of the edge sequence is invalid or valid may be determined by comparing the magnitude with a predetermined threshold. Hereinafter, a sequence for determining the valid bit and the invalid bit among the bit strings constituting the edge sequence is referred to as a "validity determination sequence".

The memory 210 according to an embodiment may store the above-described edge sequence or validity determination sequence. The edge sequence according to an embodiment may be compressed and stored in the memory 210 as a compressed edge sequence. Detailed descriptions of the edge sequence, the compressed edge sequence, and the validity determination sequence will be described later with reference to FIG. 3.

According to an embodiment, when the learning circuit 240 ends the operation on a predetermined layer, the control device 200 may receive the operation result with respect to the corresponding layer from the learning circuit 240. At this time, the operation result with respect to the corresponding layer may mean an edge sequence with respect to the corresponding layer.

The encoding circuit 220 according to an embodiment may process the edge sequence received by the control device 200 and store the edge sequence in the memory 210. For example, the processed sequence may be a compressed sequence obtained by compressing the edge sequence. In addition, for example, the processed sequence may be the validity determination sequence that distinguishes the valid bit from the invalid bit among the bit streams constituting the compressed edge sequence. The encoding circuit 220 according to an embodiment may generate the processed sequence corresponding to an operation period of the learning circuit 240. The encoding circuit 220 according to an embodiment may write the processed sequence to the memory 210. According to an embodiment, because the number of bit streams of the processed sequence is smaller than that of the sequence before compression, the encoding circuit 220 may reduce the number of writes to the memory 210. Therefore, the control device 200 may reduce power consumption due to a reduction in the number of writes.

The decoding circuit 230 according to an embodiment may transmit the processed sequence generated by the encoding circuit 220 to the learning circuit 240 to determine the connection state of edges in the neural network. The decoding circuit 230 according to an embodiment may read the processed sequence from the memory 210 such that the control device 200 sequentially outputs bit strings in the processed sequence. According to an embodiment, because the number of bit strings of the processed sequence is smaller than that of the sequence before compression, the decoding circuit 230 may reduce the number of reads from the memory 210. Therefore, the control device 200 may reduce power consumption due to a reduction in the number of reads.

Figure 3:
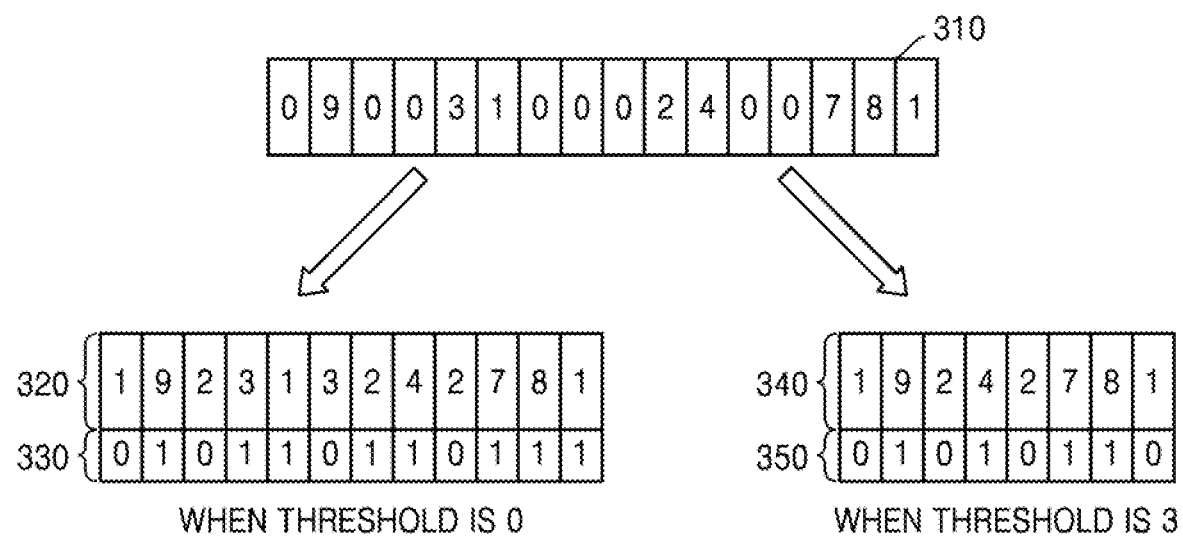
FIG. 3 is a diagram illustrating sequences generated by an encoding circuit.

FIG. 3 is a diagram illustrating sequences generated by the encoding circuit 220.

Referring to FIG. 3, an edge sequence 310, compressed edge sequences 320 and 340 and validity determination sequences 330 and 350 are illustrated.

The edge sequence 310 according to an embodiment may be information indicating the connection strength of predetermined edges. The edge sequence 310 may include bit strings. The larger the bit value included in the bit strings may mean the stronger the connection strength of the predetermined edge, and the smaller the bit value may mean the weaker the connection strength of the predetermined edge.

The edge sequence 310 according to an embodiment may include valid bits and invalid bits. Whether a bit of the edge sequence 310 is invalid or valid may be determined by comparing the magnitude with a predetermined threshold. According to an embodiment, when the bit of the edge sequence is less than or equal to a threshold, the corresponding bit may be invalid. Invalid means may mean that an edge corresponding to the corresponding bit is disconnected. Invalidating a bit of a predetermined threshold or less may be to omit unnecessary calculation in order to improve learning performance, such as pruning or dropout.

The encoding circuit 220 according to an embodiment may generate the compressed edge sequences 320 and 340 in which consecutive invalid bits among bit streams constituting the edge sequence 310 are compressed into one bit.

For example, when the predetermined threshold value is '0', among the bit streams constituting the edge sequence 310, bits having a value '0' or less may be invalid, and only bits having a value greater than '0' may be valid. In addition, among the edge sequence 310, a bit having a value less than or equal to the threshold value '0' may be continuously present. When the bit having the value equal to or less than the threshold value '0' is continuously present, the encoding circuit 220 may express this as one bit value, thereby generating the compressed edge sequence 320. In this case, the expressed bit value may indicate the number of consecutive times of the bit having the value equal to or less than the threshold value '0' in the edge sequences 310. For example, when the bit having the value equal to or less than the threshold value '0' in the edge sequences 310 is consecutive three times such as "000", "000" of the edge sequence 310 may be expressed as "3" on the compressed edge sequence 320. As such, the encoding circuit 220 may improve the operation speed of the learning circuit 240 by compressing consecutive invalid bits into one bit.

For example, when the predetermined threshold value is '3', among the bit streams constituting the edge sequence 310, bits having a value '3' or less may be invalid, and only bits having a value greater than '3' may be valid. Also, in the edge sequence 310, a bit having a value less than or equal to the threshold value '3' may be continuously present. When the bit having the value less than or equal to the threshold value '3' is continuously present, the encoding circuit 220 may express this as one bit value, thereby generating the compressed edge sequence 340. At this time, the expressed bit value may indicate the number of consecutive times of the bit having the value of less than or equal to the threshold value '3' in the edge sequences 310. For example, when the bit having the value equal to or less than the threshold value '3' in the edge sequences 310 is consecutive five times such as "00310002", "00310002" of the edge sequence 310 may be expressed as "8" on the compressed edge sequence 340. As such, the encoding circuit 220 may improve the operation speed of the learning circuit 240 by compressing consecutive invalid bits into one bit.

The encoding circuit 220 according to an embodiment may generate the validity determination sequences 330 and 350 indicating valid bits and invalid bits among the bit streams constituting the compressed edge sequences 320 and 340.

The validity determination sequences 330 and 350 according to an embodiment may be respectively binary sequences represented by '0' and '1'. For example, a value '0' included in the bit strings constituting the validity determination sequences 330 and 350 may indicate that bits of the compressed edge sequences 320 and 340 corresponding to the address of the corresponding bit are invalid bits. In addition, for example, a value '1' included in the bit strings constituting the validity determination sequences 330 and 350 may indicate that the bits of the compressed edge sequences 320 and 340 corresponding to the address of the corresponding bit are valid bits.

The decoding circuit 230 according to an embodiment may read only valid bits among the compressed edge sequences 320 and 340 from the memory 210 based on the compressed edge sequences 320 and 340 and the validity determination sequences 330 and 350. Specifically, the decoding circuit 230 may determine whether the output wait bits of the compressed edge sequences 320 and 340 are valid based on the validity determination sequences 330 and 350, when the output wait bits are invalid, skip reading the output wait bits, and when the output wait bits are valid, read the output wait bits. For example, with respect to the compressed edge sequence 320, the decoding circuit 230 may read a bit string including "93124781" which is a valid bit. Also, for example, with respect to the compressed edge sequence 340, the decoding circuit 230 may read a bit string including "9478" which is a valid bit.

According to an embodiment, the valid bits sequentially output from the control device 200 may be sequentially calculated with the weight bits of the next layer of the fully connected network stored in the learning circuit 240.

Figure 4:
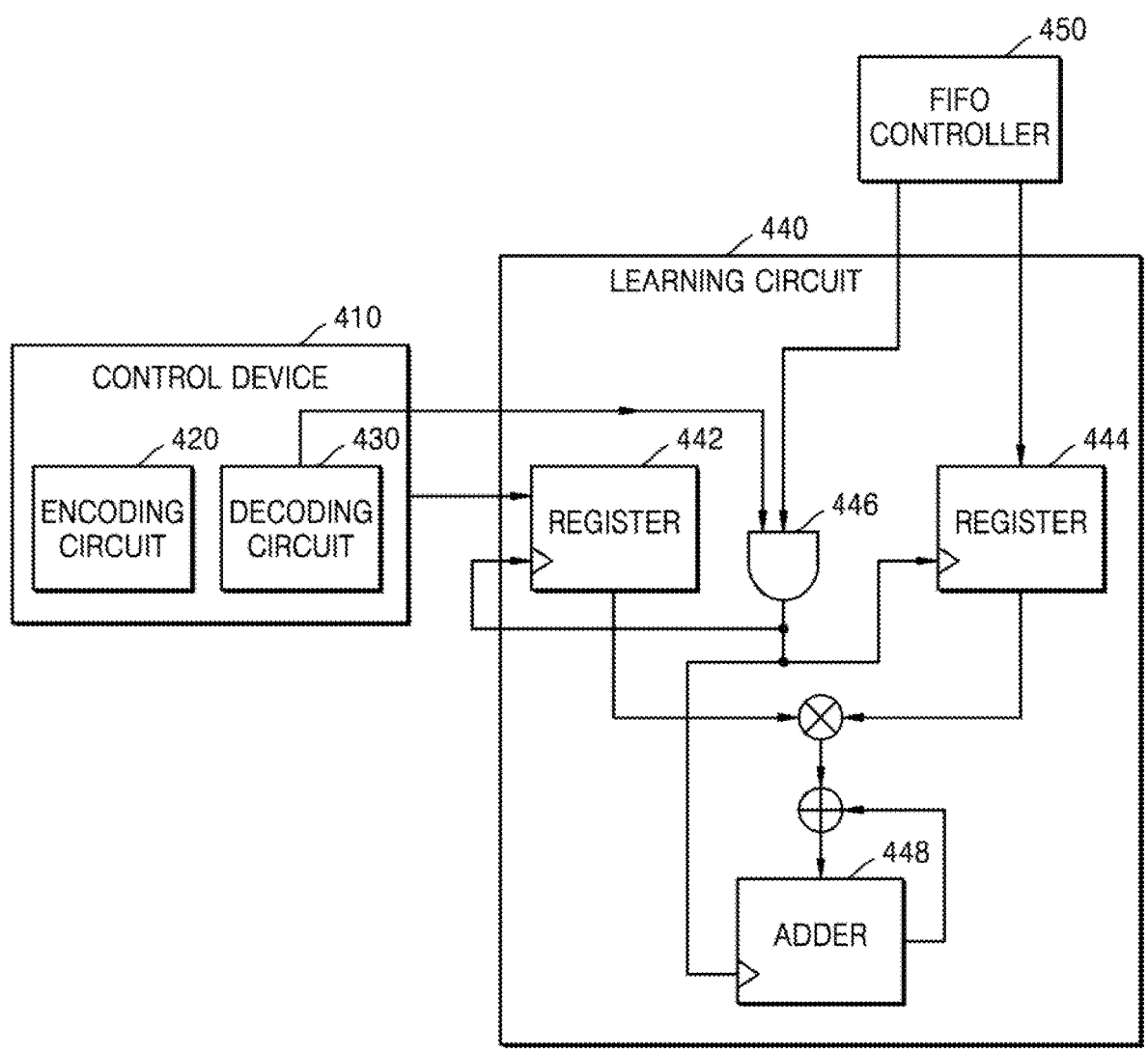
FIG. 4 is a block diagram illustrating a relationship between a control device and a learning circuit according to an embodiment.

FIG. 4 is a block diagram illustrating a relationship between a control device 410 and a learning circuit 440 according to an embodiment.

Referring to FIG. 4, the control device 410 may be connected to the learning circuit 440 that processes learning of a neural network to control input/output of data. In addition, a FIFO controller 450 may be connected to the learning circuit 440 to control input/output of data. The FIFO controller 450 may output information related to a weight matrix of a predetermined layer to the learning circuit 440.

The control device 410 according to an embodiment includes an encoding circuit 420 and a decoding circuit 430. The encoding circuit 420 and the decoding circuit 430 of FIG. 4 respectively correspond to the encoding circuit 220 and the decoding circuit 230 described above with reference to FIG. 2, and thus detailed descriptions thereof are omitted.

The learning circuit 440 according to an embodiment may perform an operation for training of the neural network. For example, the neural network may be a fully connected network. In the fully connected network, nodes included in each layer have a weight value. In the fully connected network, a signal input to the current layer may be output through an operation of the weight matrix, for example, a multiplication operation. Here, the signal input to the current layer may be matrix data having a size of N×1 (N is the number of nodes constituting the current layer). In addition, the weight matrix calculated by multiplying with the signal input to the current layer may be matrix data having a size of M×N (M is the number of nodes constituting the next layer of the current layer, and N is the number of nodes constituting the current layer). The signal output from the current layer may be input to the next layer. Here, according to an embodiment, the signal output from the current layer may be input to the next layer through control by the control device 410.

The learning circuit 440 according to an embodiment may include registers 442 and 444, a comparator 446, and an accumulator 448.

The control device 410 according to an embodiment may output a validity determination sequence read by the decoding circuit 430 from a memory to the comparator 446 of the learning circuit 440. According to an embodiment, validity determination sequences sequentially output from the control device 410 may be compared with validity determination sequences sequentially output from the FIFO controller 450 through the comparator 446.

The comparator 446 according to an embodiment may AND-operate values of two bits received from the control device 410 and the FIFO controller 450 to use the values as a clock gating signal only when the two bits are '1'. That is, when any one of the values of the two bits received from the control device 410 and the FIFO controller 450 is '0', because a clock is not applied, toggles of registers 442 and 444 may not occur. The comparator 446 according to an embodiment may serve to initiate a calculation operation only when data input to the learning circuit 440 is valid.

The register 442 according to an embodiment may store the current bit of an edge sequence received from the control device 410 based on the clock gating signal received from the comparator 446. Additionally, the register 444 may store the current bit of a weight sequence received from the FIFO controller 450 based on the clock gating signal received from the comparator 446.

According to an embodiment, the current bit of the edge sequence stored in the register 442 may be multiplied by the current bit of the weight sequence stored in the register 444. A multiplication operation result may be accumulated in an accumulator 448 and added to a next operation result. The accumulator 448 according to an embodiment may accumulate operation results until the control device 410 outputs the last bit of the edge sequence. The learning circuit 440 according to an embodiment may output the final result stored in the accumulator 448 as a result value of the current layer to the control device 410.

The registers 442 and 444 according to an embodiment may be hardware elements (e.g., processing elements) that perform systematic operations for their own purpose. A process of storing and outputting data in the registers 442 and 444 is described in detail below.

FIGS. 5A to 5H are diagrams illustrating an operation performing process of a learning circuit 580 based on the output of a control device 510 according to a first embodiment.

Referring to FIGS. 5A to 5H, the control device 510 according to the first embodiment may output data for training a neural network (e.g., a fully connected network) to the learning circuit 580. The data output from the control device 510 may be input data with respect to the current layer of the neural network. The input data with respect to the current layer output from the control device 510 may be calculated with weight data 540, 550, 560, 570 of the current layer. Such an operation may be a multiplication operation of a weight matrix (e.g., 4×4 size) and an input matrix (e.g., 4×1 size). The learning circuit 580 may perform multiplication operations between matrices using a plurality of processing elements. A data processing order between the processing elements may be sequential from the left to the right.

The learning circuit 580 may output a result obtained by calculating data output from the control device 510 and the weight data 540, 550, 560, 570 as the output of the current layer. In the calculation operations illustrated in FIGS. 5A to 5H, four bits are input to the learning circuit 580, and a threshold value for determining the validity of a bit value is 0.

Figure 5A:
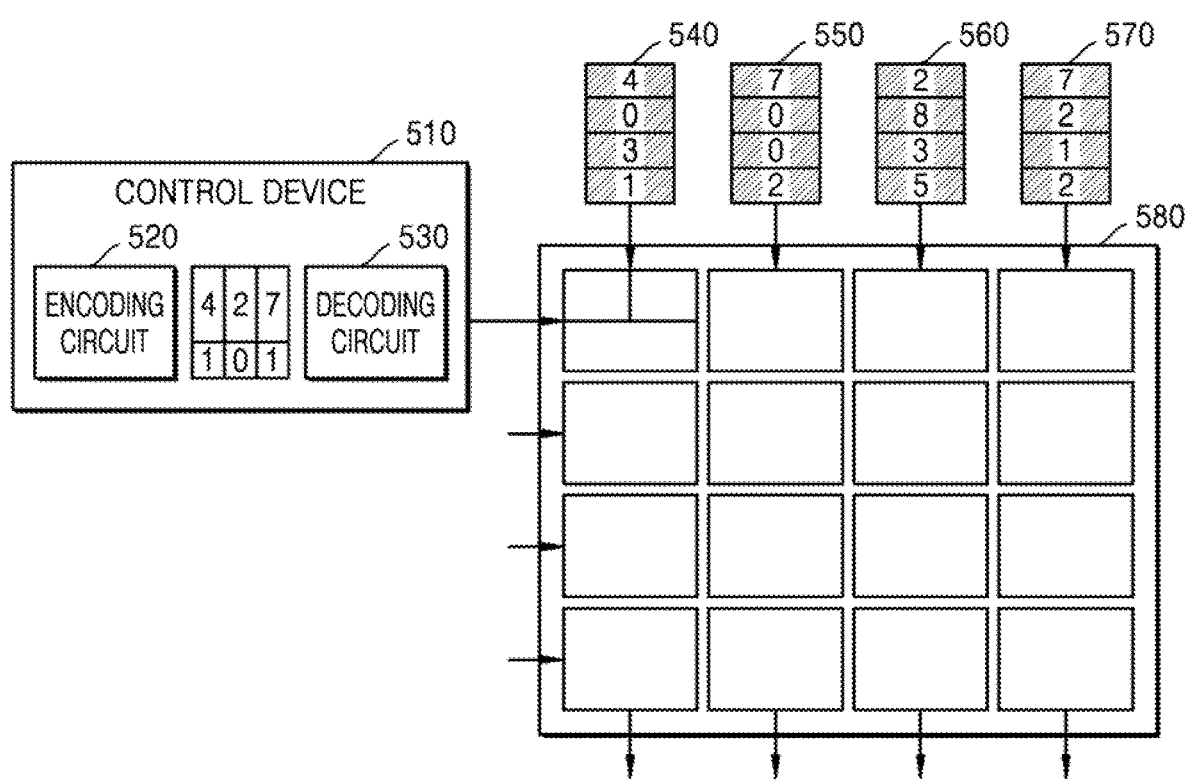
FIGS. 5A to 5H are diagrams illustrating an operation performing process of a learning circuit based on the output of a control device according to a first embodiment.

Referring to FIG. 5A, a compressed edge sequence "427" and a validity determination sequence "101" are illustrated as objects to be output by the control device 510 to the learning circuit 580. The compressed edge sequence "427" and the validity determination sequence "101" may be generated by the encoding circuit 520 and written to a memory in the control device 510. According to the first embodiment, the decoding circuit 530 may read and output an edge sequence (i.e., a compressed edge sequence) and a validity determination sequence from the memory in a first in first out (FIFO) method.

Figure 5B:
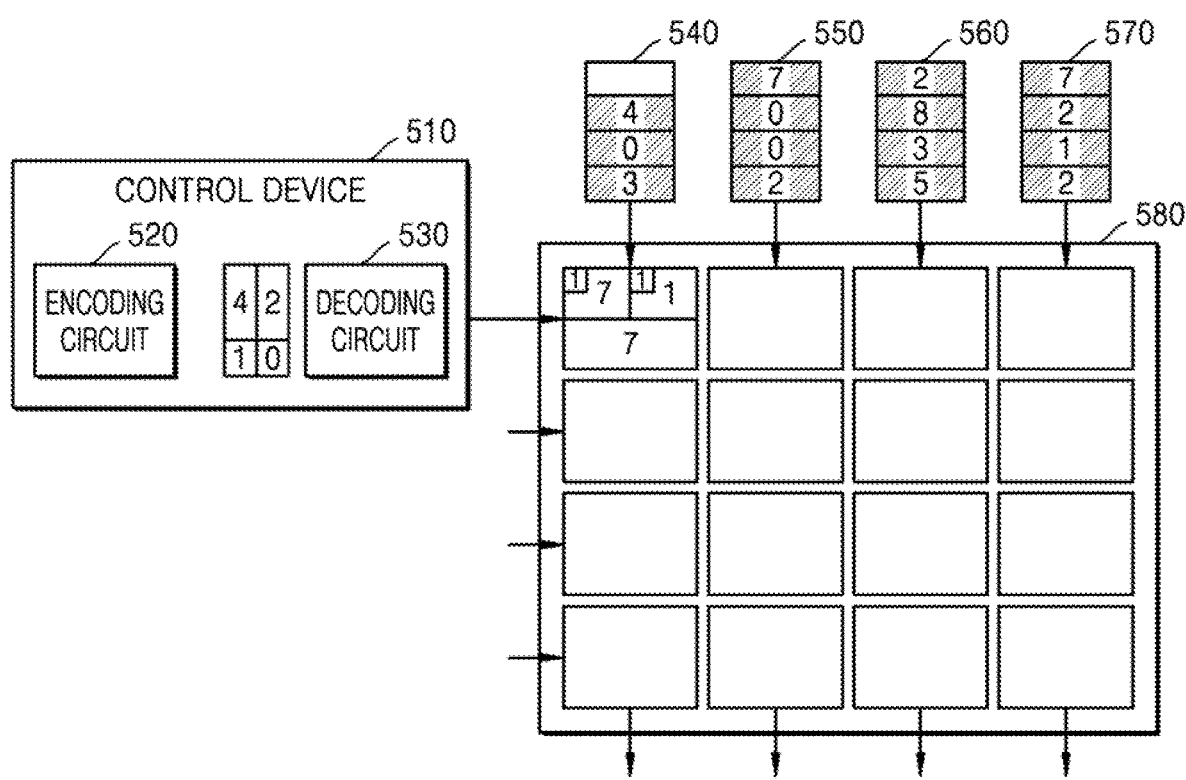

Referring to FIG. 5B, a bit '7' of the edge sequence to be output first from the control device 510 may be determined to be valid by the bit value '1' indicated by the validity determination sequence and transmitted to the processing elements of the learning circuit 580. Accordingly, the bit '7' of the edge sequence output first from the control device 510 may be multiplied with the valid bit '1' of the weight sequence 540 and stored as a value '7'.

Figure 5C:
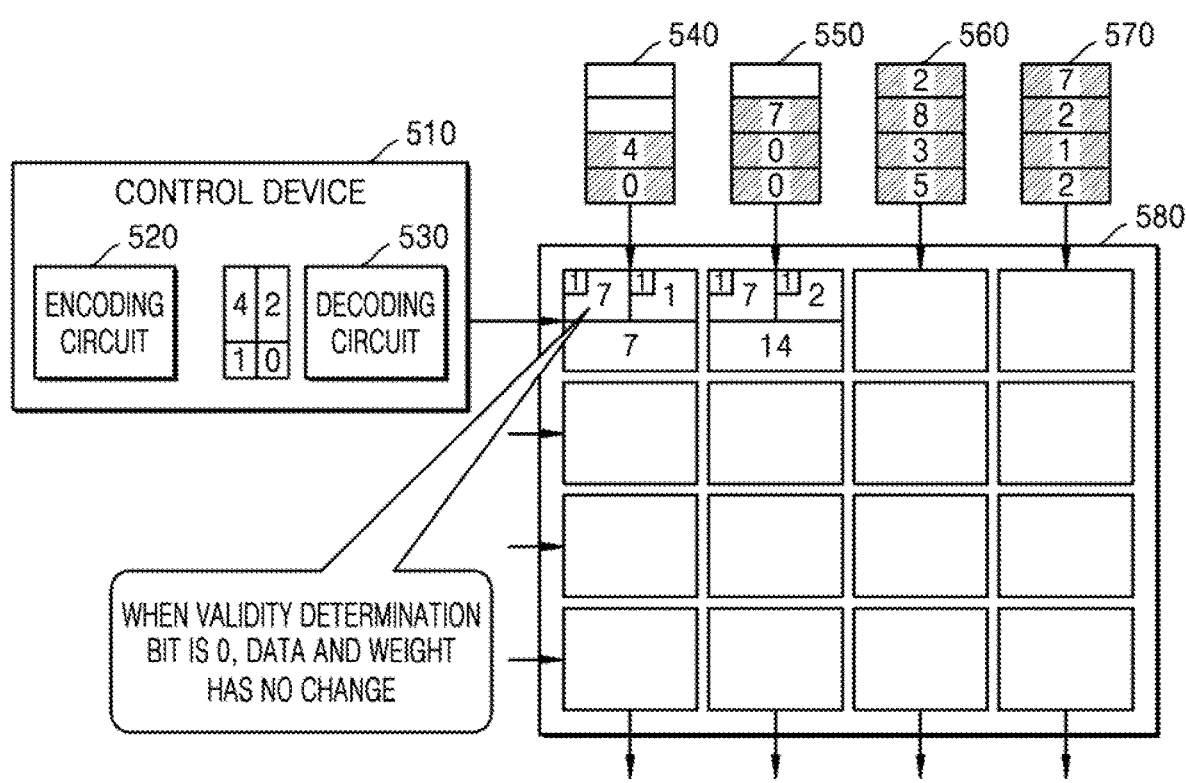

Referring to FIG. 5C, the edge sequence to be output second from the control device 510 may be determined to be invalid by a bit value '0' indicated by the validity determination sequence, and may not be transmitted to the processing elements. Accordingly, the processing elements may not perform a multiplication operation with the weight sequence 540. Therefore, the operation result with the weight sequence 540 may still be maintained at '7'. Meanwhile, the bit '7' of the edge sequence output first from the control device 510 may be transmitted to an adjacent processing element for a multiplication operation with the weight sequence 550.

Figure 5D:
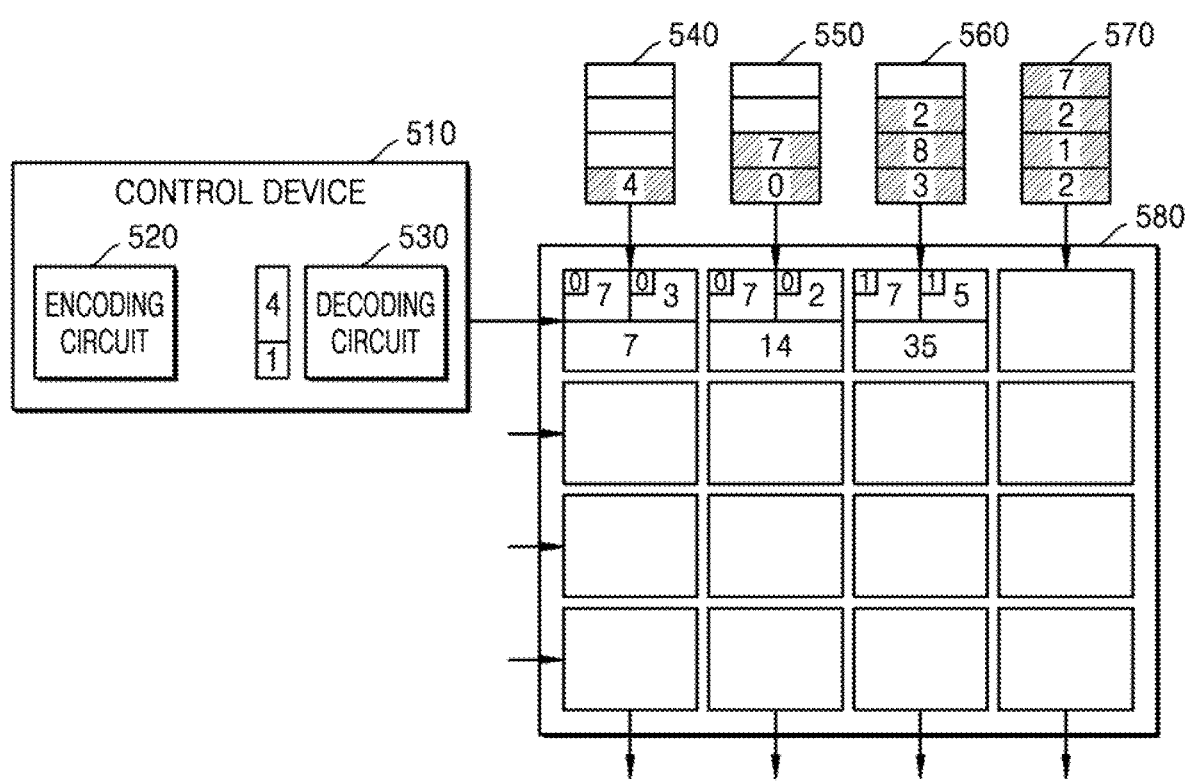

Referring to FIG. 5D, the third edge sequence to be output third from the control device 510 may be determined to be invalid by the bit value '0' indicated by the validity determination sequence, and may not be transmitted to the processing elements. Accordingly, the processing elements may not perform the multiplication operation with the weight sequence 540. Therefore, the operation result with the weight sequence 540 may still be maintained at '7'. Meanwhile, the bit '7' of the edge sequence output first from the control device 510 may be transmitted to an adjacent processing element for a multiplication operation with the weight sequence 560. Further, information indicating that the second bit of the edge sequence is invalid may be transmitted to the processing element for the operation with the weight sequence 550.

Figure 5E:
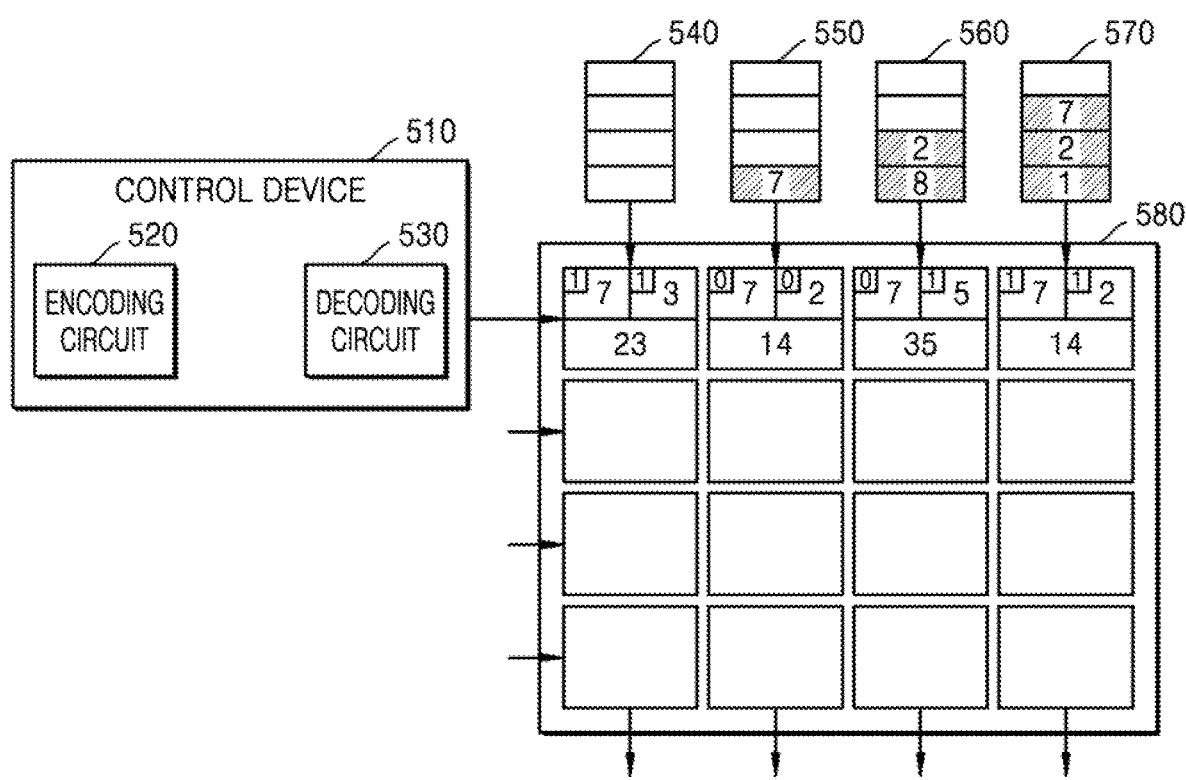

Referring to FIG. 5E, the edge sequence to be output fourth from the control device 510 may be determined to be valid by the bit value '1' indicated by the validity determination sequence, and may be transmitted to the processing elements. Accordingly, the bit '4' of the edge sequence output fourth from the control device 510 may multiplied with the valid bit '4' of the weight sequence 540, and a multiplication operation result value '16' may be added to the previously stored intermediate value '7' and stored as a final result value '23'. Meanwhile, the bit '7' of the edge sequence output first from the control device 510 may be transmitted to an adjacent processing element for the multiplication operation with the weight sequence 570. Also, information indicating that the second bit of the edge sequence is invalid may be transmitted to the processing element for the operation with the weight sequence 560. Also, information indicating that the third bit of the edge sequence is invalid may be transmitted to the processing element for the operation with the weight sequence 550.

Figure 5F:
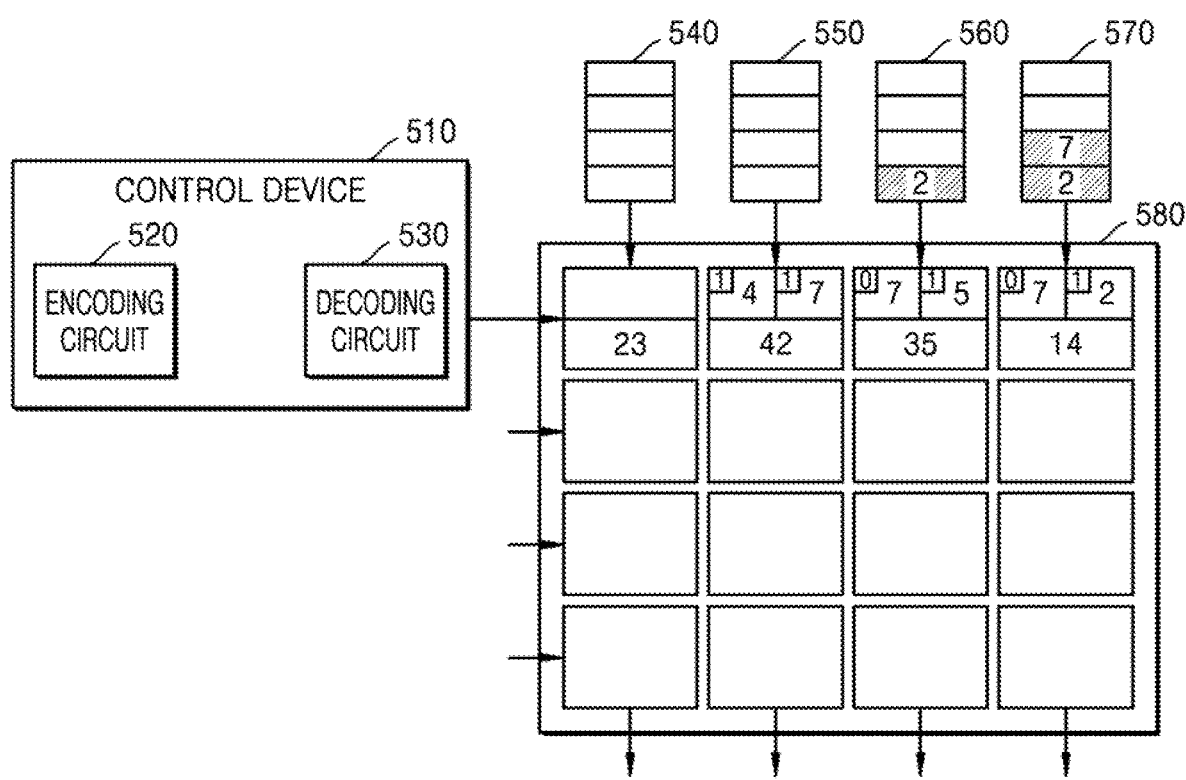

Referring to FIG. 5F, because all the edge sequences are output from the control device 510, the operation with the weight sequence 540 ends. The bit '4' of the edge sequence output fourth from the control device 510 may be multiplied with the valid bit '7' of the weight sequence 550, and a multiplication operation result value '28' may be added to the previously stored intermediate value '14' and stored as a final result value '42'.

Figure 5G:
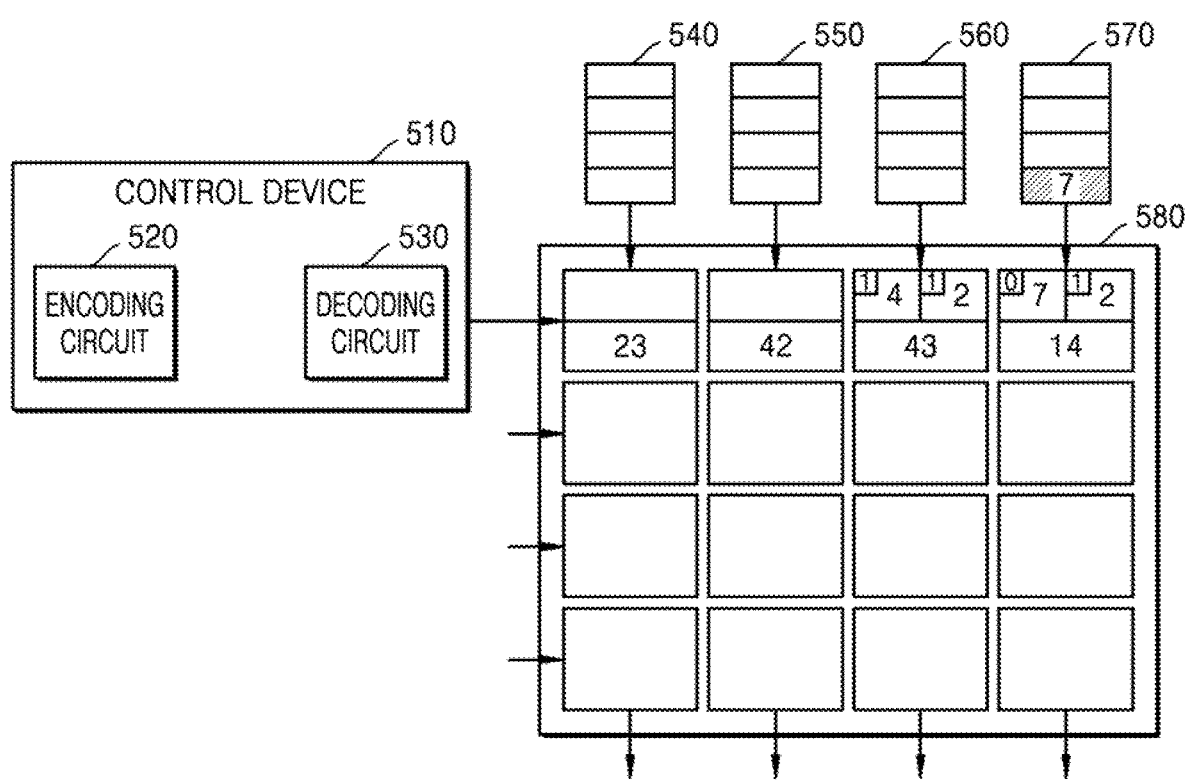

Referring to FIG. 5G, the operations with the weight sequences 540 and 550 end. The bit '4' of the edge sequence output fourth from the control device 510 may be multiplied with the valid bit '2' of the weight sequence 560, and a multiplication operation result value '8' may be added to the previously stored intermediate value '35' and stored as a final result value '43'.

Figure 5H:
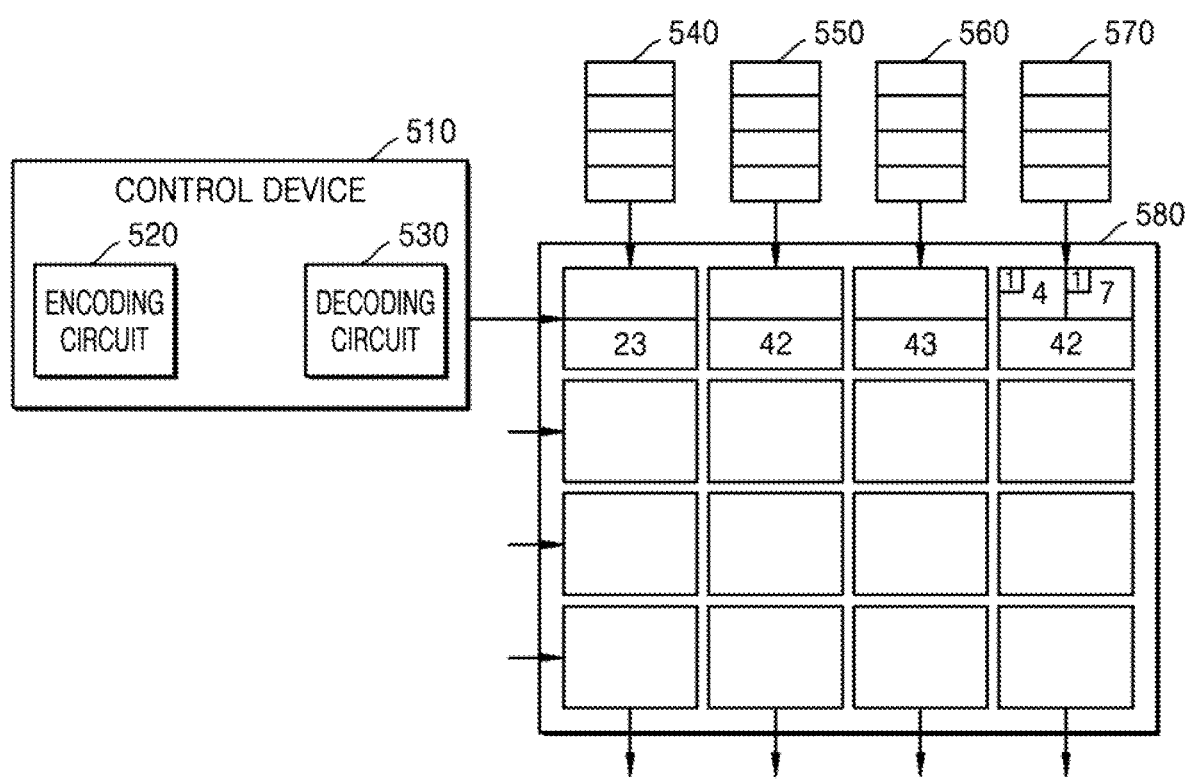

Referring to FIG. 5H, the operations with the weight sequences 540, 550, and 560 end. The bit '4' of the edge sequence output fourth from the control device 510 may be multiplied the valid bit '7' of the weight sequence 570, and a multiplication operation result value '28' may be added to the previously stored intermediate value '14' and stored as a final result value '42'.

In the operation performing process of the learning circuit 580 illustrated in FIGS. 5A to 5H, the finally output operation results of the current layer are $[23, 42, 43, 42]^T$. Such an operation result is identical with a matrix multiplication result of input data $[7, 0, 0, 4]^T$ of the current layer and the weight data 540, 550, 560, and 570.

According to the first embodiment described with reference to FIGS. 5A to 5H, the validity determination sequence output from the control device 510 may serve to toggle or trigger an operation of the processing element in the learning circuit 580.

FIGS. 6A to 6H are diagrams illustrating an operation performing process of a learning circuit 640 based on the output of a control device 610 according to a second embodiment.

Referring to FIGS. 6A to 6H, the control device 610 according to the second embodiment may output data for training a neural network (e.g., a fully connected network) to the learning circuit 640. The data output from the control device 610 may be input data with respect to the current layer of the neural network. The input data with respect to the current layer output from the control device 610 may be calculated with weight data 650 of the current layer. The learning circuit 640 may perform multiplication operations between matrices using a processing element. The learning circuit 640 may output a result obtained by calculating data output from the control device 610 and the weight data 650 as the output of the current layer.

Figure 6A:
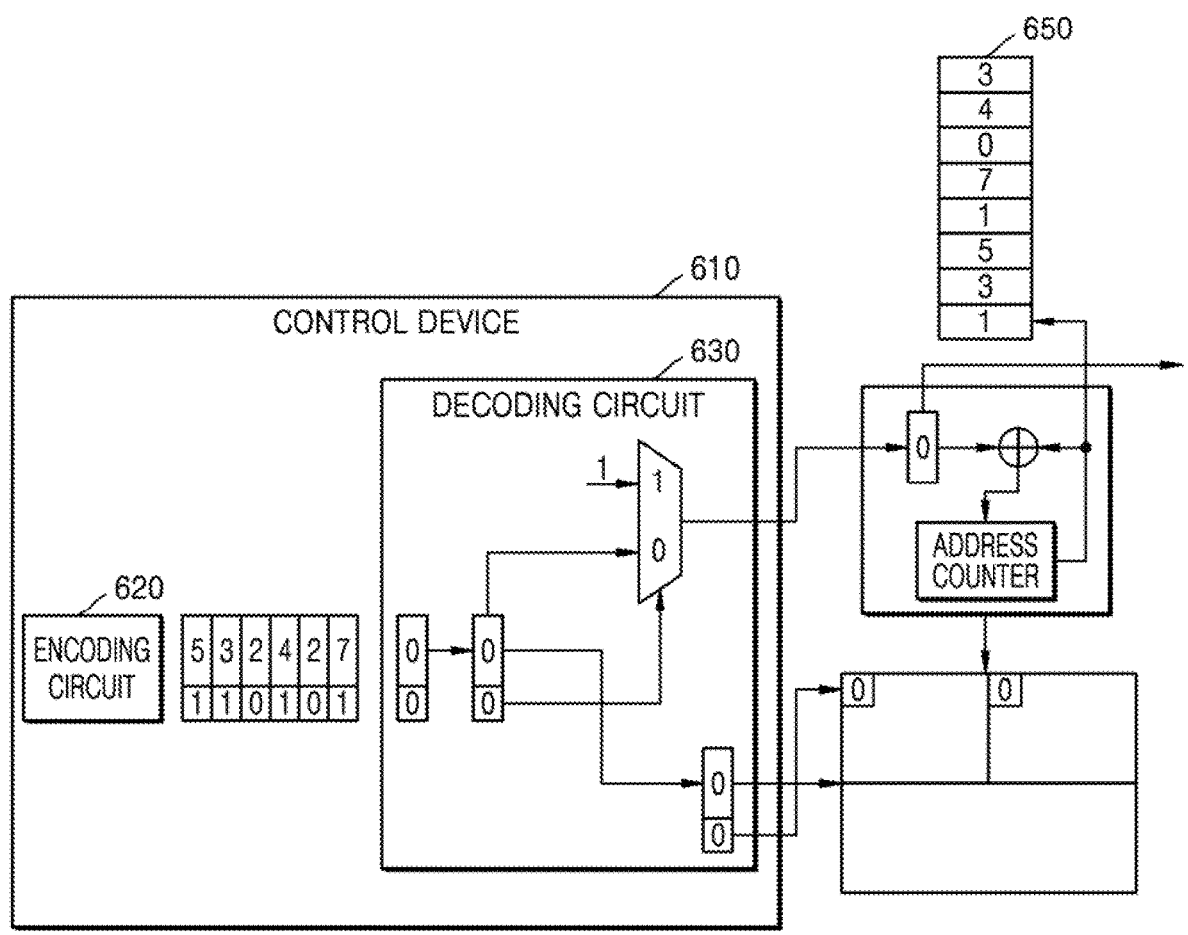
FIGS. 6A to 6H are diagrams illustrating an operation performing process of a learning circuit based on the output of a control device according to a second embodiment.

Referring to FIG. 6A, a compressed edge sequence "532427" and a validity determination sequence "110101" are illustrated as objects to be output by the control device 610 to the learning circuit 640. The compressed edge sequence "532427" and the validity determination sequence "110101" may be generated by the encoding circuit 620 and written to a memory. According to the second embodiment, the decoding circuit 630 may read and output an edge sequence and a validity determination sequence from the memory in a first in first out (FIFO) method. According to the second embodiment, when a bit value of the validity determination sequence output from the control device 610 is '0', a bit value of the edge sequence corresponding to the address may be input to an address counter. Here, the learning circuit 640 may jump an operation order to be performed next by the bit value of the edge sequence corresponding to the corresponding address. According to the second embodiment, when the bit value of the validity determination sequence output from the control device 610 is '1', the bit value '1' may be input to the address counter.

Figure 6B:
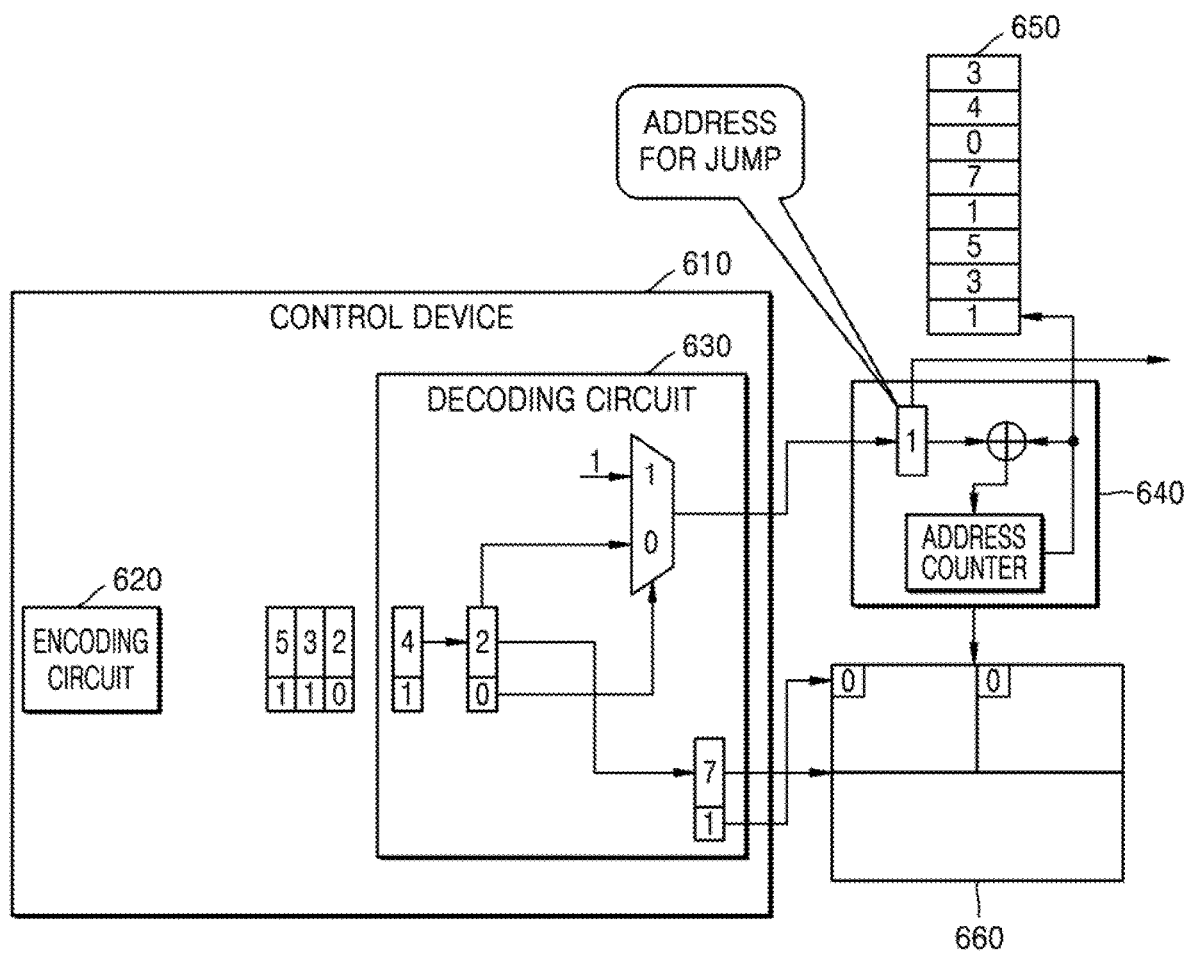

Referring to FIG. 6B, the bit value of the validity determination sequence to be output first from the control device 610 is '1'. The decoding circuit 630 of the control device 610 may identify that the bit value of the validity determination sequence waiting for output is '1'.

Figure 6C:
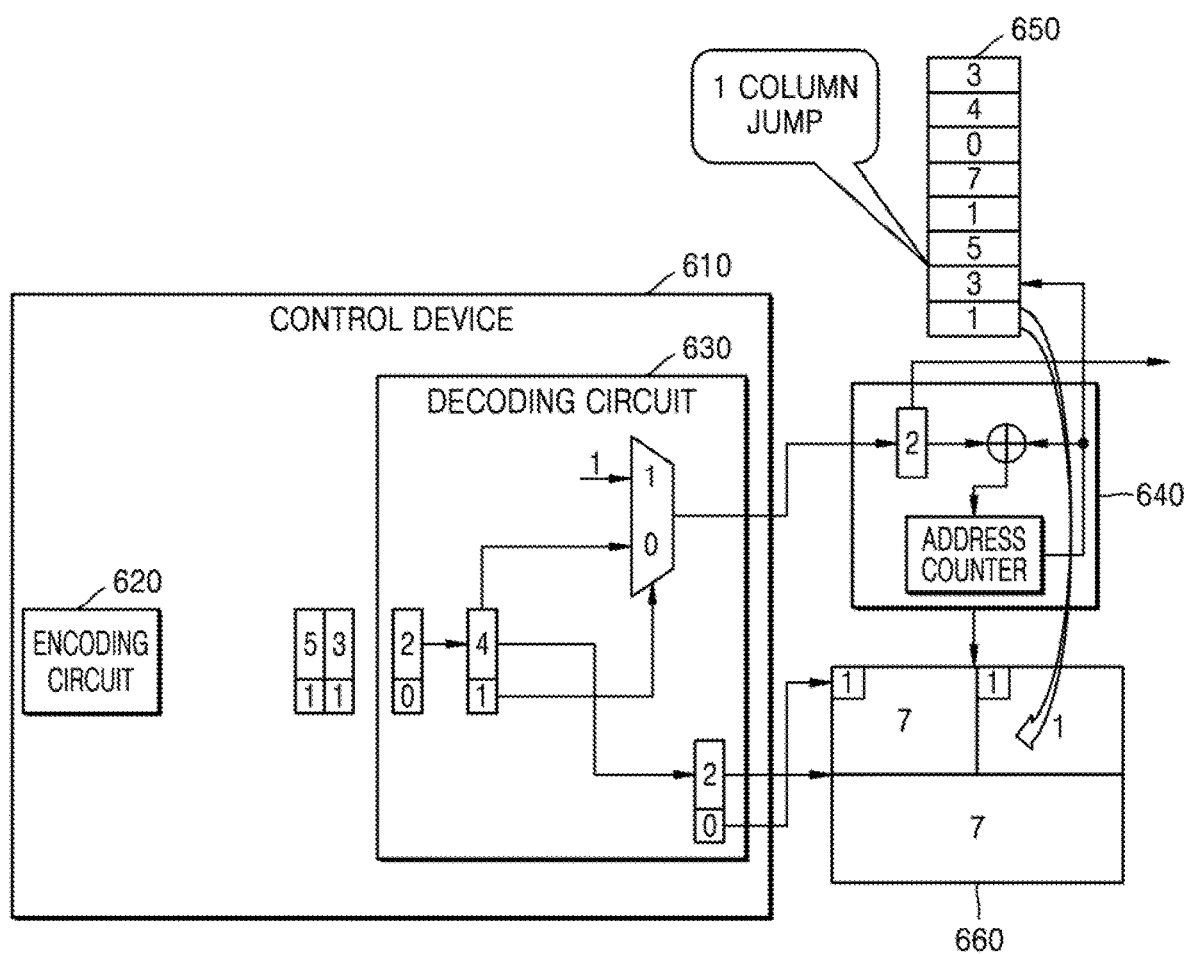

Referring to FIG. 6C, a bit value '7' of the edge sequence first output from the control device 610 and a bit value '1' first output from the weight sequence 650 may be input to a register 660. The register 660 may store the value '7' by multiplying the bit value '7' of the edge sequence and the bit value '1' of the weight sequence 650.

In addition, referring to FIG. 6C, a value '1' identified by the decoding circuit 630 in FIG. 6B may be transferred to the address counter of the learning circuit 640. The value transmitted to the address counter may mean a difference from a bit address performing the current operation to a bit address performing the next operation. That is, when the value '1' is transferred to the address counter, a bit after a 1 blank participates in the next operation. Meanwhile, at the same time, the decoding circuit 630 of the control device 610 may identify that the bit value of the validity determination sequence waiting for output (i.e., to be output second) is '0'.

Figure 6D:
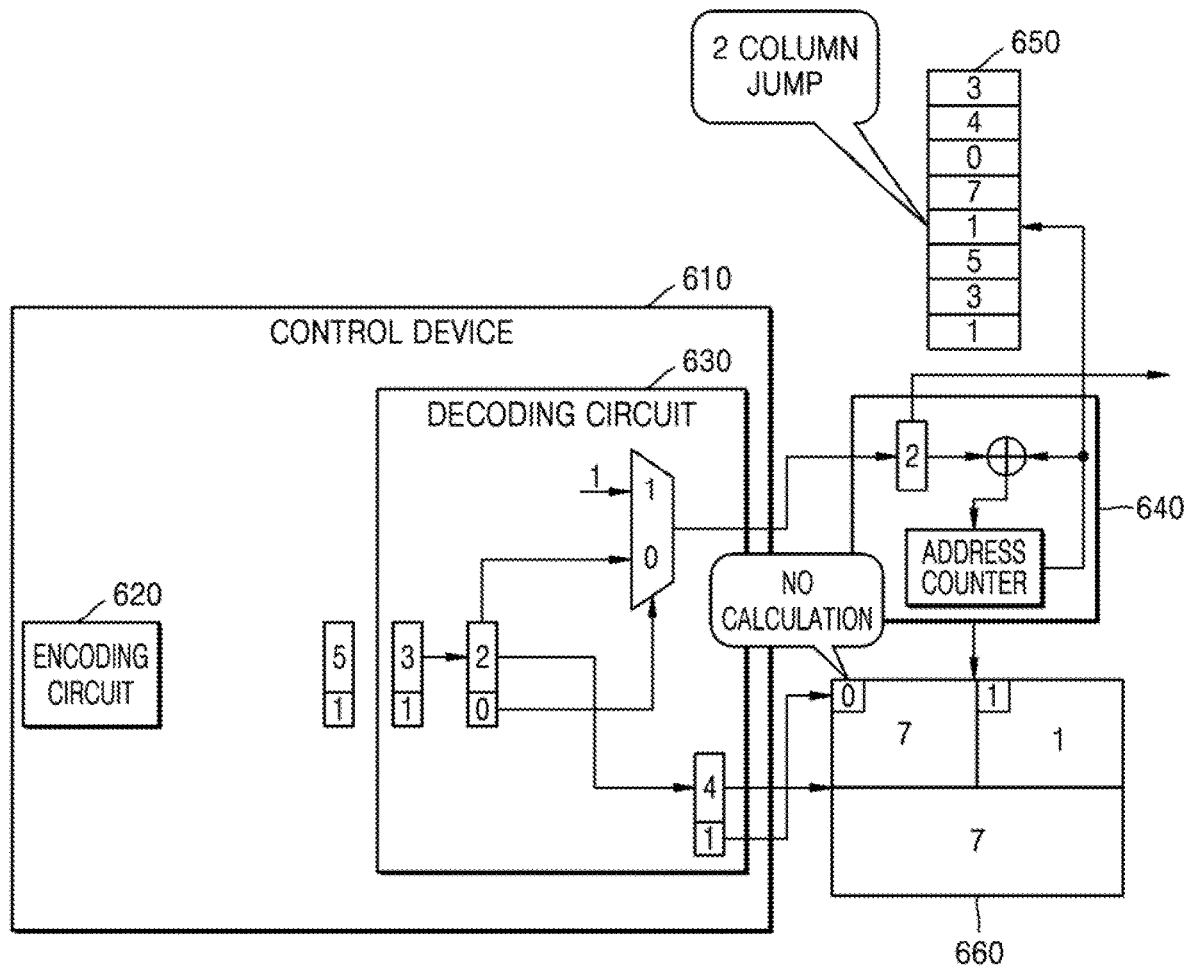

Referring to FIG. 6D, a second bit value of the edge sequence should be output from the control device 610 based on the value '1' transmitted to the address counter. However, the second bit value of the edge sequence may be determined to be invalid by the bit value '0' indicated by the validity determination sequence, and may not be transmitted to the register 660. Accordingly, the register 660 may not perform a multiplication operation with the weight sequence 650. Therefore, the value stored in the register 660 may still be maintained at the value '7'.

In addition, because the decoding circuit 630 in FIG. 6C identifies that the bit value of the validity determination sequence waiting for output is '0', the decoding circuit 630 in FIG. 6B may transmit the bit value '2' of the edge sequence corresponding to the corresponding address to the address counter of the learning circuit 640. This may mean that a bit after 2 columns participates in the next operation. Meanwhile, at the same time, the decoding circuit 630 of the control device 610 may identify that the bit value of the validity determination sequence waiting for output (i.e., to be output third) is '0'.

Figure 6E:
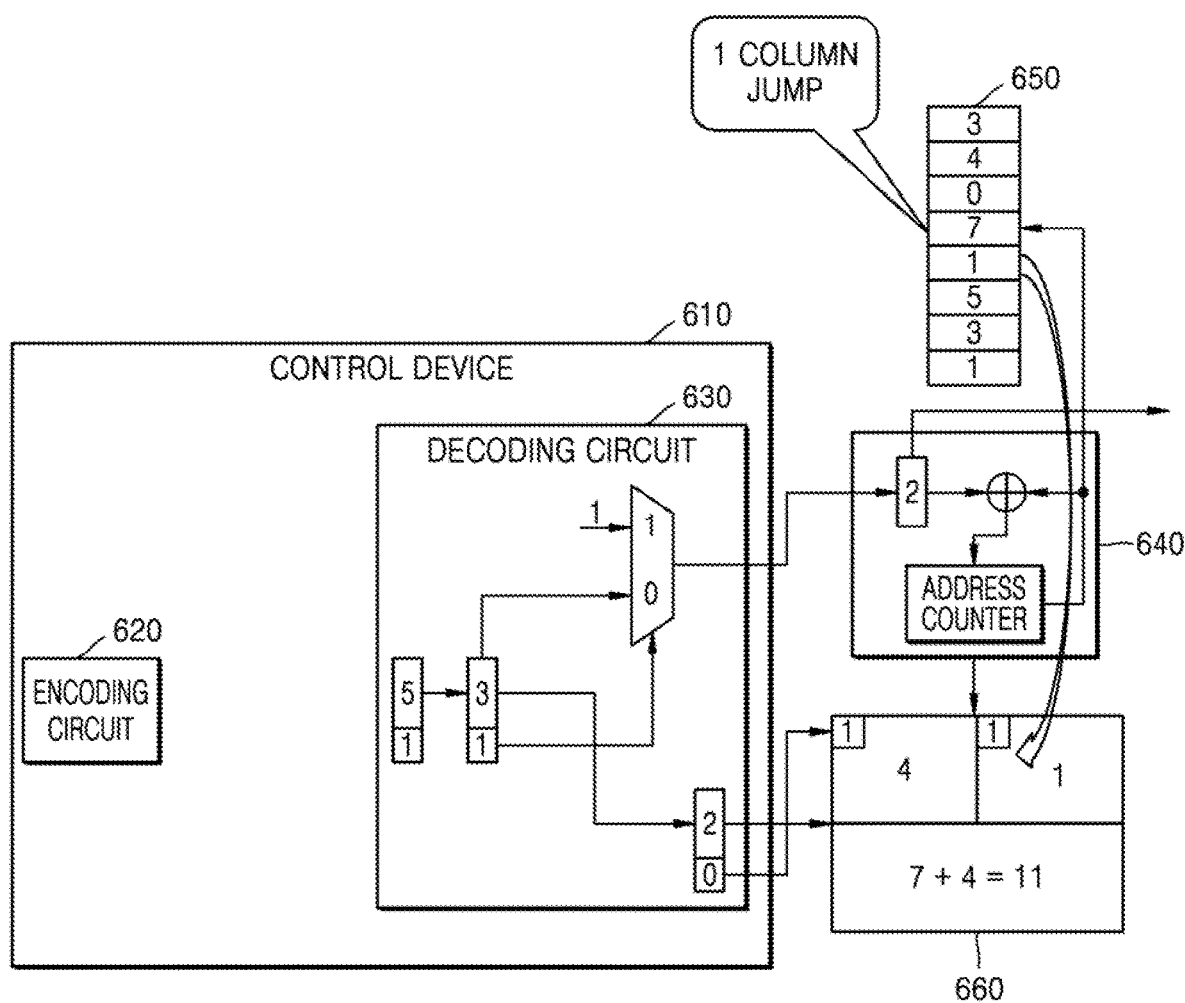

Referring to FIG. 6E, based on the value '2' transmitted to the address counter, the bit value '1' output fourth from the weight sequence 650 may be input to the register 660. The register 660 may add a value obtained by multiplying the bit value '4' of the edge sequence and the bit value '1' of the weight sequence 650 to the previously stored intermediate result value '7' and store the value as a value '11'.

In addition, because the decoding circuit 630 in FIG. 6D identifies that the bit value of the validity determination sequence waiting for output is '0', the decoding circuit 630 in FIG. 6E may transmit the bit value '2' of the edge sequence corresponding to the corresponding address to the address counter of the learning circuit 640. This may mean that a bit after 2 columns participates in the next operation. Meanwhile, at the same time, the decoding circuit 630 of the control device 610 may identify that the bit value of the validity determination sequence waiting for output is '1'.

Figure 6F:
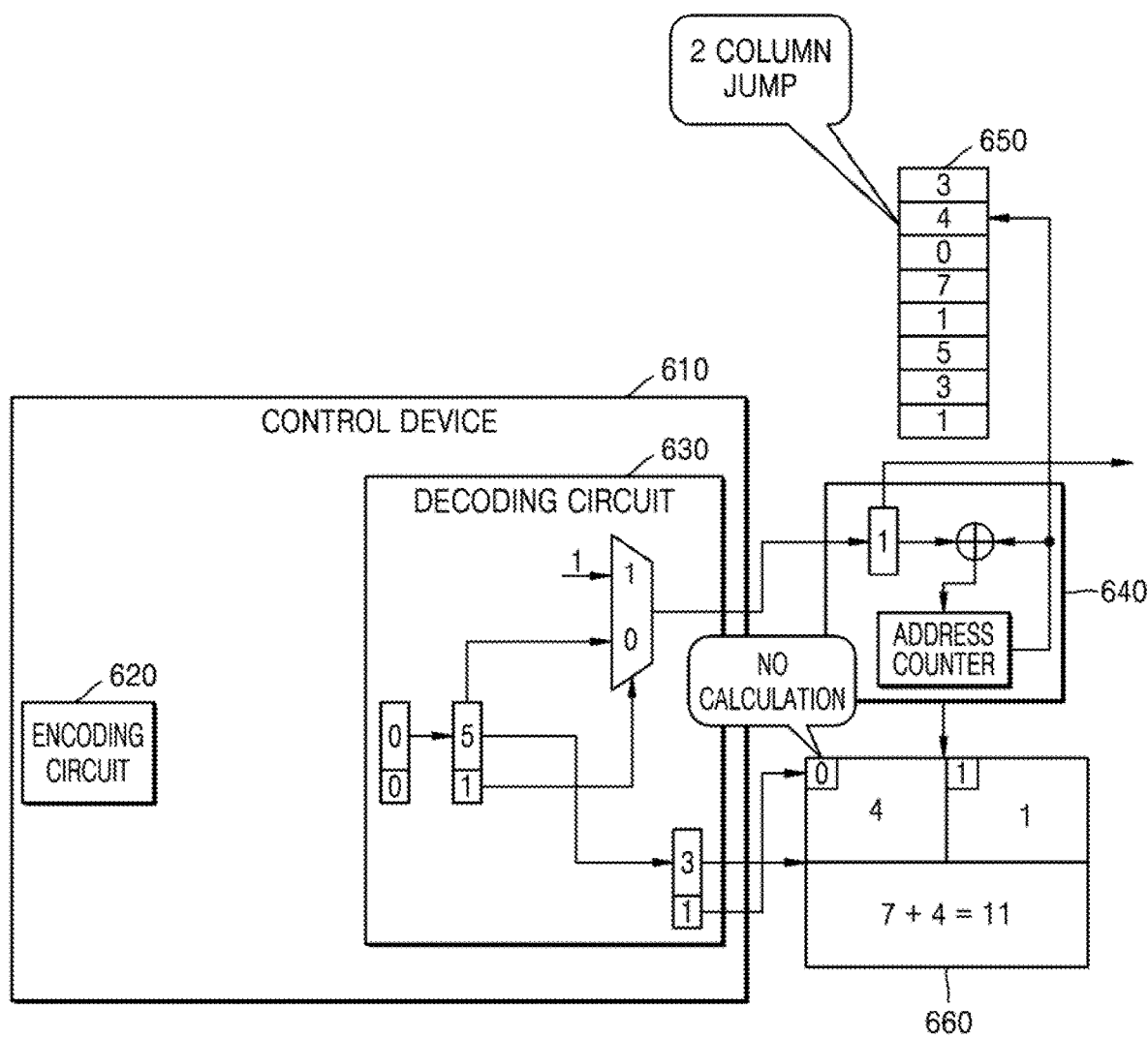

Referring to FIG. 6F, based on the value '2' transmitted to the address counter, a sixth bit value of the weight sequence 650 needs to be input to the register 660. However, the sixth bit value of the weight sequence 650 may not be transmitted to the register 660 as '0'. Accordingly, the register 660 may not perform the multiplication operation, and the value stored in the register 660 may still be maintained at the value '11'.

In addition, because the decoding circuit 630 in FIG. 6E identifies that the bit value of the validity determination sequence waiting for output is '1', the decoding circuit 630 in FIG. 6F may transmit the value '1' to the address counter of the learning circuit 640. This may mean that a bit after 1 column participates in the next operation. Meanwhile, at the same time, the decoding circuit 630 of the control device 610 may identify that the bit value of the validity determination sequence waiting for output is '1'.

Figure 6G:
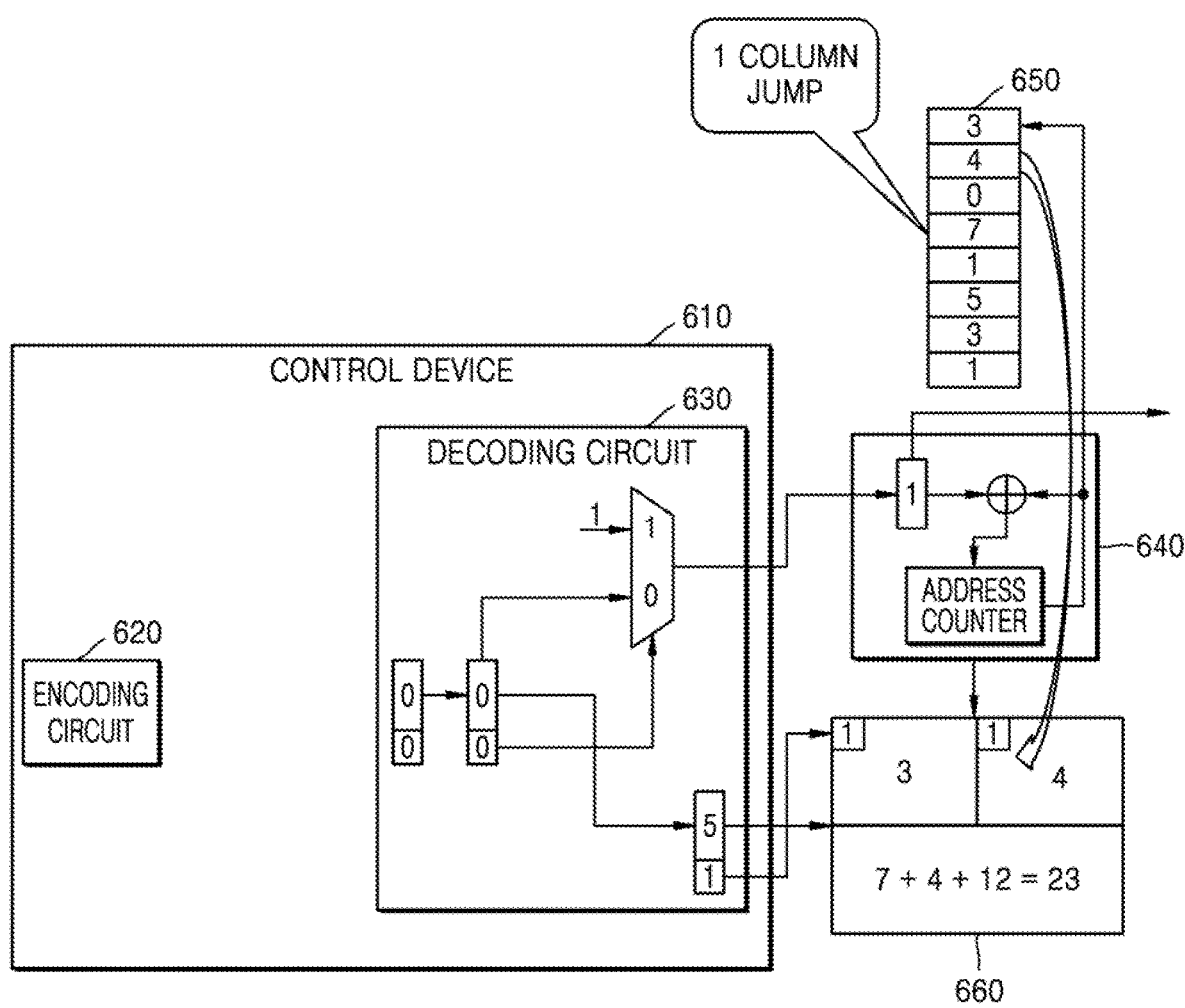

Referring to FIG. 6G, based on the value '1' transmitted to the address counter, the bit value '4' output seventh from the weight sequence 650 may be input to the register 660. The register 660 may add a value obtained by multiplying the bit value '3' of the edge sequence and the bit value '4' of the weight sequence 650 to the previously stored intermediate result value '11' and store the value as a value '23'.

In addition, because the decoding circuit 630 in FIG. 6F identifies that the bit value of the validity determination sequence waiting for output is '1', the decoding circuit 630 in FIG. 6G may transmit the value '1' to the address counter of the learning circuit 640. This may mean that a bit after 1 column participates in the next operation.

Figure 6H:
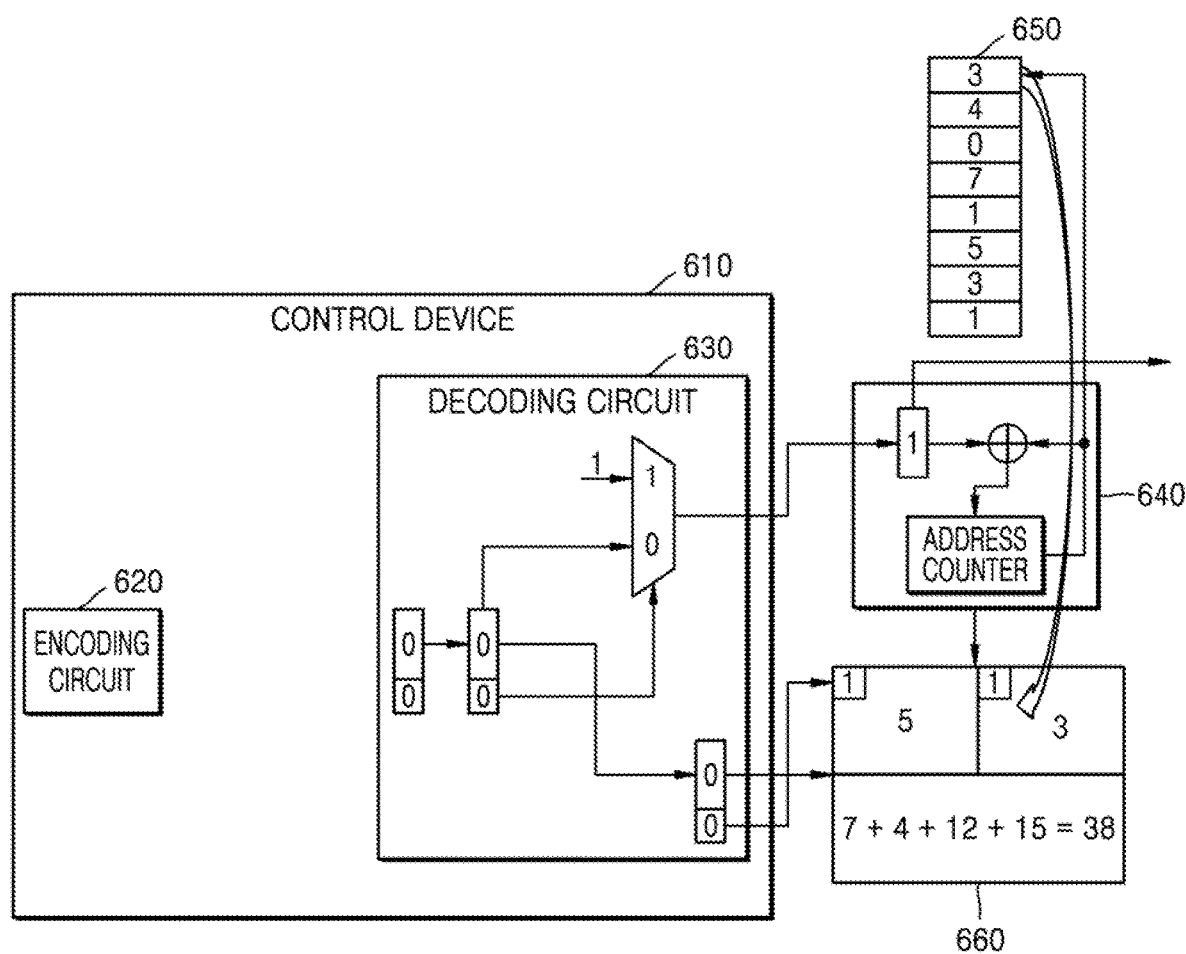

Referring to FIG. 6H, based on the value '1' transmitted to the address counter, the bit value '3' output eighth from the weight sequence 650 may be input to the register 660. The register 660 may add a value obtained by multiplying the bit value '5' of the edge sequence and the bit value '3' of the weight sequence 650 to the previously stored intermediate result value '23' and store the value as a value '38'.

According to the second embodiment described with reference to FIGS. 6A to 6H, the validity determination sequence output from the control device 610 may be used to jump an operation processing step of the learning circuit 640.

Figure 7:
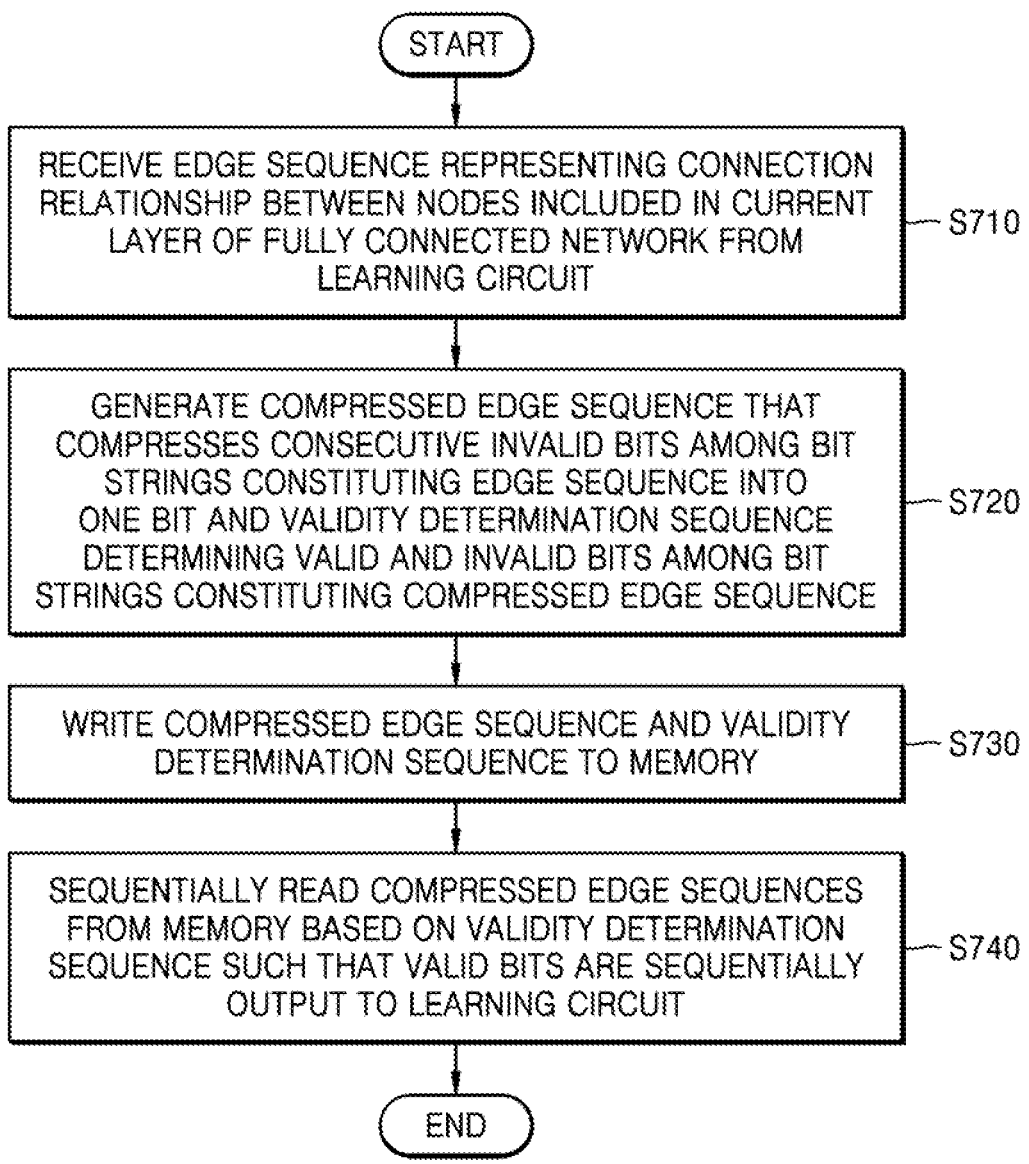
FIG. 7 is a flowchart illustrating a control method according to an embodiment.

FIG. 7 is a flowchart illustrating a control method according to an embodiment.

In operation S710, the control device 200 may receive an edge sequence representing a connection relationship between nodes included in the current layer of a fully connected network from a learning circuit.

In operation S720, the control device 200 may generate a compressed edge sequence that compresses consecutive invalid bits among bit strings constituting the edge sequence into one bit and a validity determination sequence determining valid and invalid bits among the bit strings constituting the compressed edge sequence.

In operation S730, the control device 200 may write the compressed edge sequence and the validity determination sequence to a memory.

In operation S740, the control device 200 may sequentially read the compressed edge sequences from the memory based on the validity determination sequence such that the valid bits are sequentially output to the learning circuit.

The device according to an embodiment may include a processor, a memory for storing program data and executing it, a permanent storage such as a disk drive, a communications port for communicating with external devices, and user interface devices, such as a touch panel, a key, a button, etc. Methods implemented with a software module or algorithm may be stored as computer-readable code or program commands executable on the processor on computer-readable recording media. Here, examples of the computer-readable recording media may include a magnetic storage medium (e.g., read-only memory (ROM), random-access memory (RAM), a floppy disk, a hard disk, etc.) and an optical medium (e.g., a compact disc-ROM (CD-ROM), a digital versatile disc (DVD), etc. The computer-readable recording medium may also be distributed over network-coupled computer systems such that computer-readable code is stored and executed in a distributed fashion. The medium may be read by a computer, stored in a memory, and executed by a processor.

The embodiment may be represented by block components and various process operations. Such functional blocks may be implemented by various numbers of hardware and/or software components which perform specific functions. For example, the embodiment may employ various integrated circuit components, e.g., memory elements, processing elements, logic elements, look-up tables, and the like, which may carry out a variety of functions under the control of one or more microprocessors or other control devices. Similarly, where the elements of the present disclosure are implemented using software programming or software elements the disclosure may be implemented with any programming or scripting language such as C, C++, Java, assembler, or the like, with the various algorithms being implemented with any combination of data structures, objects, processes, routines or other programming elements. Functional aspects may be implemented as an algorithm executed in one or more processors. Furthermore, the embodiment may employ any number of conventional techniques for electronics configuration, signal processing and/or control, data processing and the like. The term "mechanism", "element", "means", or "component" is used broadly and is not limited to mechanical or physical embodiments. The term may include a series of routines of software in conjunction with the processor or the like.

The invention claimed is:

1. A control device connected to a learning circuit that processes learning of a fully connected network, the control device controlling input and output of data, and comprising:
   a memory;
   an encoding circuit configured to:
      receive, from the learning circuit, an edge sequence representing a connection relationship between nodes included in a current layer of the fully connected network,
      generate a compressed edge sequence that compresses consecutive invalid bits among bit strings constituting the edge sequence into one bit and a validity determination sequence determining valid bits and invalid bits among the bit strings constituting the compressed edge sequence, and
      write the compressed edge sequence and the validity determination sequence to the memory; and
   a decoding circuit configured to sequentially read the compressed edge sequence from the memory based on the validity determination sequence and sequentially output the valid bits to the learning circuit.

2. The control device of claim 1, wherein each of the valid bits is greater than a predetermined threshold, and each of the invalid bits is not greater than the predetermined threshold.

3. The control device of claim 1, wherein the compressed edge sequence comprises bits indicating the number of the consecutive invalid bits.

4. The control device of claim 1, wherein a bit value at a position in the validity determination sequence corresponding to a position of a valid bit in the compressed edge sequence is '1', and a bit value at a position in the validity determination sequence corresponding to a position of an invalid bit in the compressed edge sequence is '0'.

5. The control device of claim 1, wherein the decoding circuit is further configured to determine whether an output wait bit of the compressed edge sequence is valid based on the validity determination sequence, skip reading the output wait bit when the output wait bit is invalid, and read the output wait bit when the output wait bit is valid.

6. The control device of claim 1, wherein the validity determination sequence is used as a clock gating signal for performing an operation of the learning circuit.

7. The control device of claim 1, wherein the validity determination sequence is used to jump an operation processing step of the learning circuit.

8. A control method performed by a control device connected to a learning circuit that processes learning of a fully connected network, the control device controlling input and output of data, the control method comprising:
   receiving, from the learning circuit, an edge sequence representing a connection relationship between nodes included in a current layer of the fully connected network;
   generating a compressed edge sequence that compresses consecutive invalid bits among bit strings constituting the edge sequence into one bit and a validity determination sequence determining valid bits and invalid bits among the bit strings constituting the compressed edge sequence;
   writing the compressed edge sequence and the validity determination sequence to a memory;
   sequentially reading the compressed edge sequence from the memory based on the validity determination sequence; and
   sequentially outputting the valid bits to the learning circuit.

9. The control method of claim 8, wherein each of the valid bits is greater than a predetermined threshold, and each of the invalid bits is not greater than the predetermined threshold.

10. The control method of claim 8, wherein the compressed edge sequence comprises bits indicating the number of the consecutive invalid bits.

11. The control method of claim 8, wherein a bit value at a position in the validity determination sequence corresponding to a position of a valid bit in the compressed edge sequence is '1', and a bit value at a position in the validity determination sequence corresponding to a position of an invalid bit in the compressed edge sequence is '0'.

12. The control method of claim 8, wherein the reading comprises:
   determining whether an output wait bit of the compressed edge sequence is valid based on the validity determination sequence;
   skipping reading the output wait bit when the output wait bit is invalid; and
   reading the output wait bit when the output wait bit is valid.

13. The control method of claim 8, wherein the validity determination sequence is used as a clock gating signal for performing an operation of the learning circuit.

14. The control method of claim 8, wherein the validity determination sequence is used to jump an operation processing step of the learning circuit.

15. A non-transitory computer-readable recording medium having recorded thereon instructions that, when executed by a control device, cause the control device to:
   receive, from a learning circuit, an edge sequence representing a connection relationship between nodes included in a current layer of a fully connected network;
   generate a compressed edge sequence that compresses consecutive invalid bits among bit strings constituting the edge sequence into one bit and a validity determination sequence determining valid bits and invalid bits among the bit strings constituting the compressed edge sequence;
   write the compressed edge sequence and the validity determination sequence to a memory;
   sequentially read the compressed edge sequence from the memory based on the validity determination sequence; and
   sequentially output the valid bits to the learning circuit.

* * * * *